(12) United States Patent
Kim et al.

(10) Patent No.: US 11,069,641 B2
(45) Date of Patent: Jul. 20, 2021

(54) INTEGRATED CIRCUIT PACKAGE AND DISPLAY DEVICE USING THE SAME

(71) Applicant: LG DISPLAY CO., LTD., Seoul (KR)

(72) Inventors: Daehwan Kim, Paju-si (KR); Jeongho Kang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/535,628

(22) Filed: Aug. 8, 2019

(65) Prior Publication Data

US 2020/0051940 A1 Feb. 13, 2020

(30) Foreign Application Priority Data

Aug. 8, 2018 (KR) .................. 10-2018-0092499
May 27, 2019 (KR) .................. 10-2019-0062001

(51) Int. Cl.
| | |
|---|---|
| *H01L 23/00* | (2006.01) |
| *H01L 27/32* | (2006.01) |
| *H01L 51/00* | (2006.01) |
| *G09G 3/3225* | (2016.01) |

(52) U.S. Cl.
CPC ........... *H01L 24/14* (2013.01); *G09G 3/3225* (2013.01); *H01L 27/3276* (2013.01); *H01L 51/0097* (2013.01); *G09G 2300/0408* (2013.01); *G09G 2330/04* (2013.01); *H01L 2224/14517* (2013.01); *H01L 2251/5338* (2013.01); *H01L 2251/5392* (2013.01); *H01L 2924/1426* (2013.01)

(58) Field of Classification Search
CPC . H01L 24/14; H01L 27/3276; H01L 51/0097; G09G 3/3225
See application file for complete search history.

(56) References Cited

U.S. PATENT DOCUMENTS

| | | | |
|---|---|---|---|
| 10,276,548 B2 * | 4/2019 | Chen | ................. H01L 24/92 |
| 2015/0279792 A1 * | 10/2015 | Matsui | ............... G02F 1/13452 |
| | | | 257/737 |
| 2019/0148327 A1 * | 5/2019 | Chen | ................ H01L 27/3244 |
| | | | 257/737 |

FOREIGN PATENT DOCUMENTS

KR 10-2015-0038842 A 4/2015

* cited by examiner

*Primary Examiner* — Christine A Enad
(74) *Attorney, Agent, or Firm* — Birch, Stewart, Kolasch & Birch, LLP

(57) ABSTRACT

An integrated circuit package and a display device using the same are discussed. The bottom surface of the integrated circuit package includes a first barrier bump area in which a plurality of barrier bumps is arranged, configured to be disposed between an input bump area and an output bump area; and a second barrier bump area in which a plurality of barrier bumps is arranged, configured to be disposed between the first barrier bump area and the output bump area. The first barrier bump area is closer to the input bump area than the second barrier bump area, and the second barrier bump area is closer to the output bump area than the first barrier bump area.

20 Claims, 26 Drawing Sheets

INTEGRATED CIRCUIT PACKAGE AND DISPLAY DEVICE USING THE SAME

This application claims the priority benefit of Korean Patent Application No. 10-2018-0092499 filed on Aug. 8, 2018 and Korean Patent Application No. 10-2019-0062001 filed on May 27, 2019, both filed in the Republic of Korea, the entire contents of all these applications are is incorporated herein by reference for all purposes as if fully set forth herein.

BACKGROUND OF THE INVENTION

Field of the Invention

The disclosure relates to an integrated circuit package and a display device using the same.

Related Art

Flat panel displays include a liquid crystal display (LCD), an electroluminescence display, a field emission display (FED), a plasma display panel (PDP), etc. The electroluminescence display is divided into an inorganic light emitting display device and an organic light emitting display device according to emission layer materials. An active matrix type organic light emitting display includes spontaneous emission type organic light emitting diodes (OLEDs) and has the advantages of a high response speed, a high emission efficiency, a highlight luminance and a wide viewing angle.

Such a display device displays images on a screen of a flat display panel in which data lines and gate lines (or scan lines) intersect and pixels are arranged in a matrix form. A driver for driving one or more of the data lines and gate lines of the flat panel display can be realized as an integrated circuit (hereinafter referred to as an "IC") mounted in a chip.

An IC package can be directly bonded to a display panel through a chip on panel (COP) bonding process. The COP bonding process is a laminating process of interposing an anisotropic conductive film (ACF) between the IC package and the display panel and pressing the IC package with heat and pressure. As a result of the COP bonding process, bumps of the IC package are electrically connected to the pads of the display panel through conductive balls of the ACF, and thus output signals of the IC package can be applied to signal lines of the display panel.

In the COP bonding process, the conductive balls of the ACF can move between neighboring bumps while congregating toward the bumps of the IC package. Accordingly, neighboring bumps can be short-circuited due to conductive balls positioned therebetween.

SUMMARY OF THE INVENTION

Various embodiments of the present disclosure provide an integrated circuit (IC) package according to claim 1. Further embodiments are described in the dependent claims. The disclosure provides an IC package and a display device including the same which can prevent generation of short-circuit due to congregation of conductive balls.

It will be appreciated by persons skilled in the art that the objects that could be achieved with the present disclosure are not limited to what has been particularly described hereinabove and the above and other objects that the present disclosure could achieve will be more clearly understood from the following detailed description.

The bottom surface of an integrated circuit package according to an embodiment of the disclosure includes an input bump area in which a plurality of input bumps are arranged; an output bump area in which a plurality of output bumps are arranged, the output bump area being separated from the input bump area; a first barrier bump area disposed between the input bump area and the output bump area and including a plurality of barrier bumps; and a second barrier bump area disposed between the first barrier bump area and the output bump area and including a plurality of barrier bumps. The first barrier bump area is close to the input bump area. The second barrier bump area is close to the output bump area.

A display device according to at least one embodiment of the disclosure includes a substrate including a pixel array through which images are displayed, and the aforementioned integrated circuit package.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DESCRIPTION OF THE EMBODIMENTS

Figure 1:
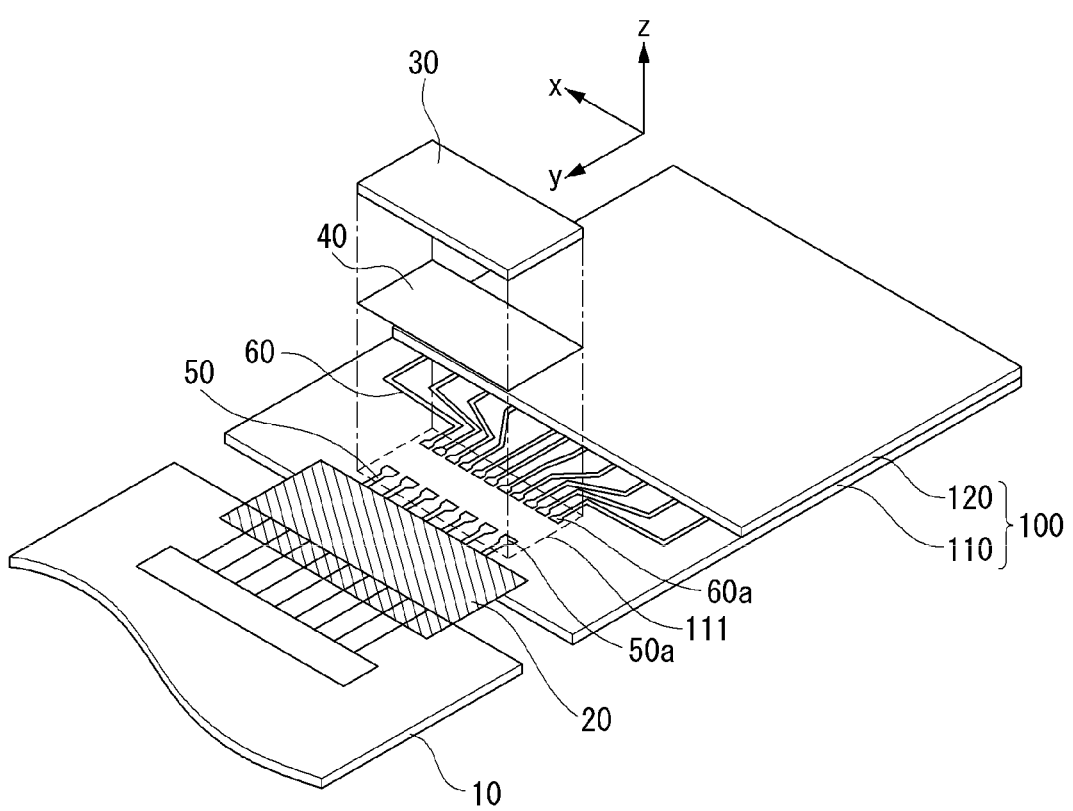
FIG. 1 is a diagram showing a display device according to an example of the disclosure.

Reference will now be made in detail to embodiments of the disclosure, examples of which are illustrated in the accompanying drawings. However, the present disclosure is not limited to embodiments disclosed below, and can be implemented in various forms. These embodiments are provided so that the present disclosure will be described more completely, and will fully convey the scope of the present disclosure to those skilled in the art to which the present disclosure pertains. The scope of the present disclosure can be defined by particular features of the claims.

Shapes, sizes, ratios, angles, number, and the like illustrated in the drawings for describing embodiments of the disclosure are merely exemplary, and the present disclosure is not limited thereto unless specified as such. Like reference numerals designate like elements throughout. In the following description, a detailed description of certain functions or configurations related to this document that can unnecessarily cloud the gist of the disclosure have been omitted or may have been described briefly.

In the present disclosure, when the terms "include", "have", "comprised of", etc. are used, other components can be added unless "—only" is used. A singular expression can include a plural expression as long as it does not have an apparently different meaning in context.

In the explanation of components, even if there is no separate description, it is interpreted as including margins of error or an error range.

In the description of positional relationships, when a structure is described as being positioned "on or above", "under or below", "next to" another structure, this description should be construed as including a case in which the structures directly contact each other as well as a case in which a third structure is disposed therebetween.

The terms "first", "second", etc. can be used to distinguish various components. However, functions or structures of the components are not limited by names of the components and ordinal numbers prefixed to the component names.

The features of embodiments of the disclosure can be partially combined or entirely combined with each other, and can be technically interlocking-driven in various ways. The embodiments can be independently implemented, or can be implemented in conjunction with each other.

A display device of the disclosure can be implemented as a liquid crystal display (LCD), an electroluminescence display, a field emission display (FED), a plasma display panel (PDP), or the like. The electroluminescence display is divided into an inorganic light emitting display device and an organic light emitting display device according to emission layer materials. Pixels of the organic light emitting display device display images using organic light emitting diodes (OLEDs) that are spontaneous emission elements.

The organic light emitting display device does not require a backlight unit and can be formed on a flexible plastic substrate, a thin glass substrate or a metal substrate. Accordingly, an organic light emitting display device can be realized as a flexible display.

The size of the screen of the flexible display can be changed through a method of rolling, folding or bending a flexible display panel. The flexible display can be realized as a rollable display, a bendable display, a foldable display, a slidable display, or the like. Such flexible display devices can be applied to TVs, vehicle displays, wearable devices as well as mobile devices such as smartphones and tablet PCs and their applications are expanded.

The display panel of the flexible display is a flexible display panel manufactured using a flexible plastic substrate. The flexible display panel can be realized as a plastic OLED panel.

The plastic OLED panel includes a pixel array on an organic thin film attached to a back plate. A touch sensor array can be formed on the pixel array. The back plate can be a polyethylene terephthalate (PET) substrate. The back plate blocks permeation of moisture such that the pixel array is not exposed to humidity and supports the organic thin film on which the pixel array is formed. The organic thin film can be a thin polyimide (PI) film substrate.

Multiple buffer layers can be formed on the organic thin film using insulating materials. Interconnection lines for supplying power or signals applied to the pixel array and the touch sensor array can be formed on the organic thin film. In the plastic OLED panel, a pixel circuit includes an OLED used as a light emitting element, a driving element for driving the OLED, a plurality of switching elements for switching a current path between the driving element and the OLED, and a capacitor connected to the driving element.

When an IC package is pressed on a plastic substrate with heat and pressure in a COP bonding process, the plastic substrate rises to the bottom surface of the IC package. This phenomenon hardly occurs in glass substrates and metal substrates but severely appears in plastic substrates. Plastic substrates are seriously deformed by heat or pressure. When the plastic substrate rises to the IC package during the COP bonding process, conductive balls of an ACF move to input and output bumps of the IC package and bumps of the IC package can be short-circuited when conductive balls congregate between the bumps.

It is noted that the display device of the disclosure can be a flexible display panel formed on a plastic substrate but the display device is not limited thereto.

In the following description of embodiments, bumps can be interpreted as electrodes, terminals or the like through which electrical signals are input and output. Barrier bumps serve to block flow of conductive balls of an ACF or perform guidance of a moving path of the conductive balls in a COP bonding process for bonding an IC package to a substrate of a display panel. The barrier bumps are disposed on the bottom surface of an IC package along with input and output bumps. The barrier bumps can be interpreted as dummy electrodes, dummy bumps, dummy terminals, dams or the like in a floating state to which electrical signals are not applied.

Hereinafter, embodiments of the disclosure will be described with reference to the drawings.

Figure 2:
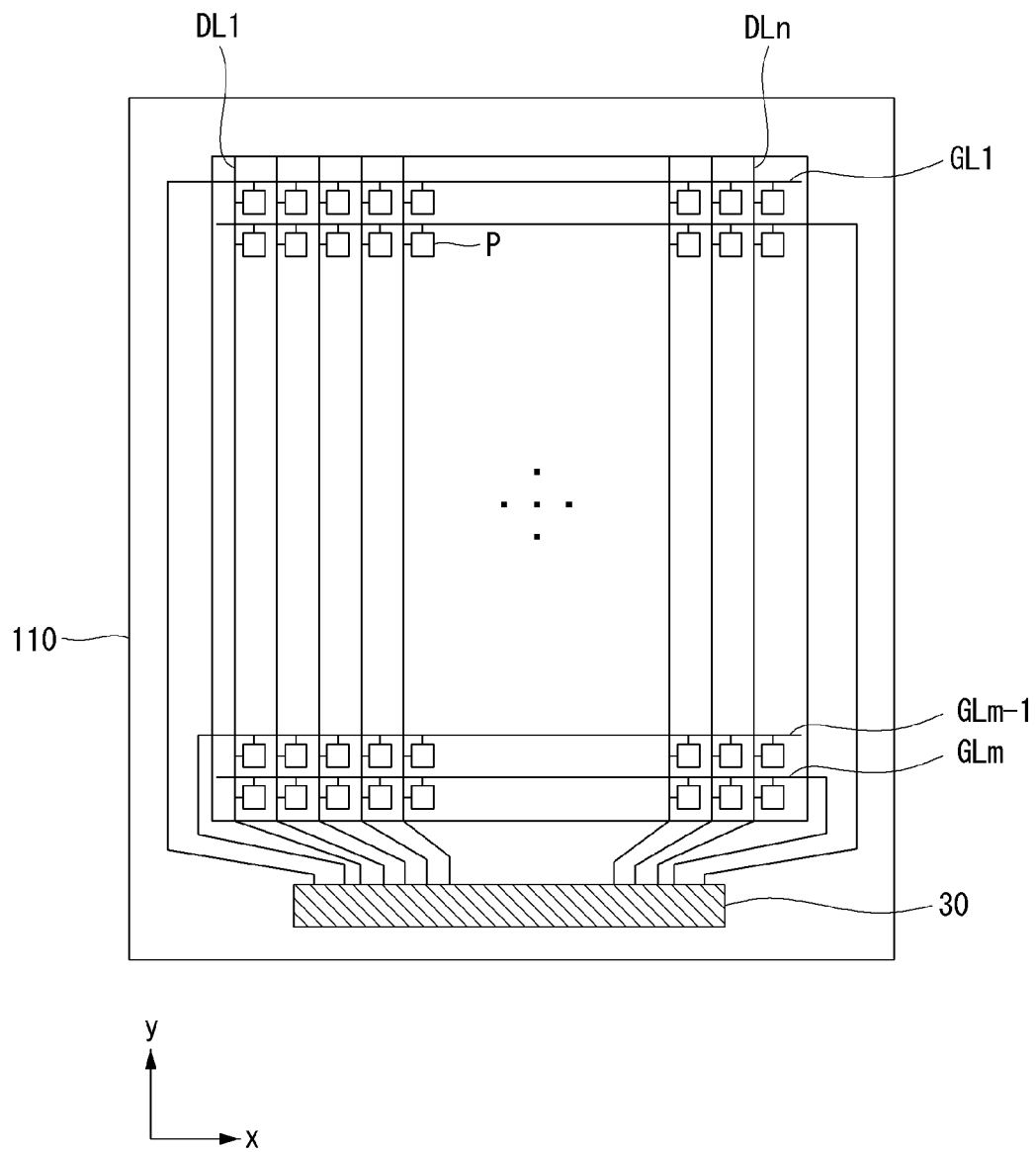
FIG. 2 is a diagram showing a first substrate on which a pixel array is disposed according to an example of the disclosure.

FIG. 1 is a diagram schematically showing a display device according to the disclosure and FIG. 2 is a diagram showing an array structure of a display panel to which an IC package has been bonded. All components of the display devices according to all embodiments of the disclosure are operatively coupled and configured.

Referring to FIGS. 1 and 2, the display device according to the disclosure includes a circuit board 10, a flexible circuit board 20, a display panel 100 and an IC package 30.

Each of the display panel 100, the IC package 30, the circuit board 10, the flexible circuit board 20 and an ACF 40 has a length in a first direction x, a length in a second direction y perpendicular to the first direction x on the xy plane, and a thickness in a third direction z perpendicular to the xy plane.

The circuit board 10 includes a circuit formed on a printed circuit board. The circuit board 10 includes a timing controller that transmits pixel data to the IC package 30, a power supply circuit, etc. The power supply circuit generates power necessary to drive a pixel array of the display panel 100 and an integrated circuit of the IC package using a DC-DC converter. The DC-DC converter can include a charge pump, a regulator, a Buck converter, a boost converter, and the like. The circuit board 10 can be electrically connected to the display panel 10 through the flexible circuit board 20.

The flexible circuit board 20 can be a flexible printed circuit (FPC). Output pads of the flexible circuit board 20 are bonded to pads of the display panel 100 through a tape automated bonding (TAB) process. The pads are formed at one edge of the display panel 100 to which the flexible circuit board 20 is bonded. The pads are connected to one end of each input line 50.

The display panel 100 includes a pixel array through which images are displayed. The IC package 30 includes an integrated circuit connected to the pixel array to drive the pixel array. The IC package 30 is bonded to a substrate 110 of the display panel 100 in a COP bonding process.

The display panel 100 includes the first substrate 110 on which the pixel array is formed and a second substrate 120 attached to the first substrate 110. The second substrate 120 can be an encapsulation substrate of an organic light emitting display device.

The first substrate 110 of the display panel 100 includes a plurality of signal lines and the pixel array in which pixels P are arranged in a matrix form. The signal lines include a plurality of data lines DL1 to DLn, and a plurality of gate lines GL1 to GLm intersecting the data lines DL1 to DLn. The pixels P are disposed in a matrix form according to the intersecting structure of the data lines DL1 to DLn and the gate lines GL1 to GLm.

Each pixel P can be divided into a red sub-pixel, a green sub-pixel and a blue sub-pixel for color expression. Each pixel P can further include a white sub-pixel. The input lines 50 of the first substrate 110 are connected to the flexible circuit board 20 and output lines 60 are connected to the data lines DL1 to DLn or the gate lines GL1 to GLm of the display panel 100. Data voltages of an input image are applied to the data lines DL1 to DLn. Scan signals synchronized with the data voltages are applied to the gate lines GL1 to GLm.

The IC package 30 can be an integrated circuit that drives the data lines DL1 to DLn or an integrated circuit that drives the gate lines GL1 to GLm. Alternatively, the IC package 30 can be an integrated circuit that drives all of the data lines DL1 to DLn and the gate lines GL1 to GLm, as shown in FIG. 2.

The IC package 30 can be integrated and mounted on the first substrate 100 on which the data lines DL1 to DLn and the gate lines GL1 to GLm are formed in a COP bonding process.

The COP bonding process bonds the IC package 30 to an IC mounting surface 111 of the first substrate 110 and connects input and output bumps IB and OB of the IC package 30 to pads 50a and 60a of the input and output lines 50 and 60 formed on the first substrate 110 of the display panel 100.

After the COP bonding process, the IC package 30 is bonded to the substrate 110 of the display panel 100 to cover the IC mounting surface 111. The input bumps of the IC package 30 are one-to-one connected to the input pads 50a connected to other ends of the input lines 50. The output bumps of the IC package 30 are one-to-one connected to the output pads 60a each being connected to one end of each of the output lines 60.

The COP bonding process electrically connects the input bumps of the IC package 30 to the input lines 50 of the display panel 10 through conductive balls of the ACF 40 by pressing the IC package 30 against the ACF 40 in a state the ACF 40 has been aligned on the first substrate 110 of the display panel 100. In addition, the COP bonding process electrically connects the output bumps of the IC package 30 to the output lines 60 of the display panel 10 through conductive balls of the ACF.

Figure 3:
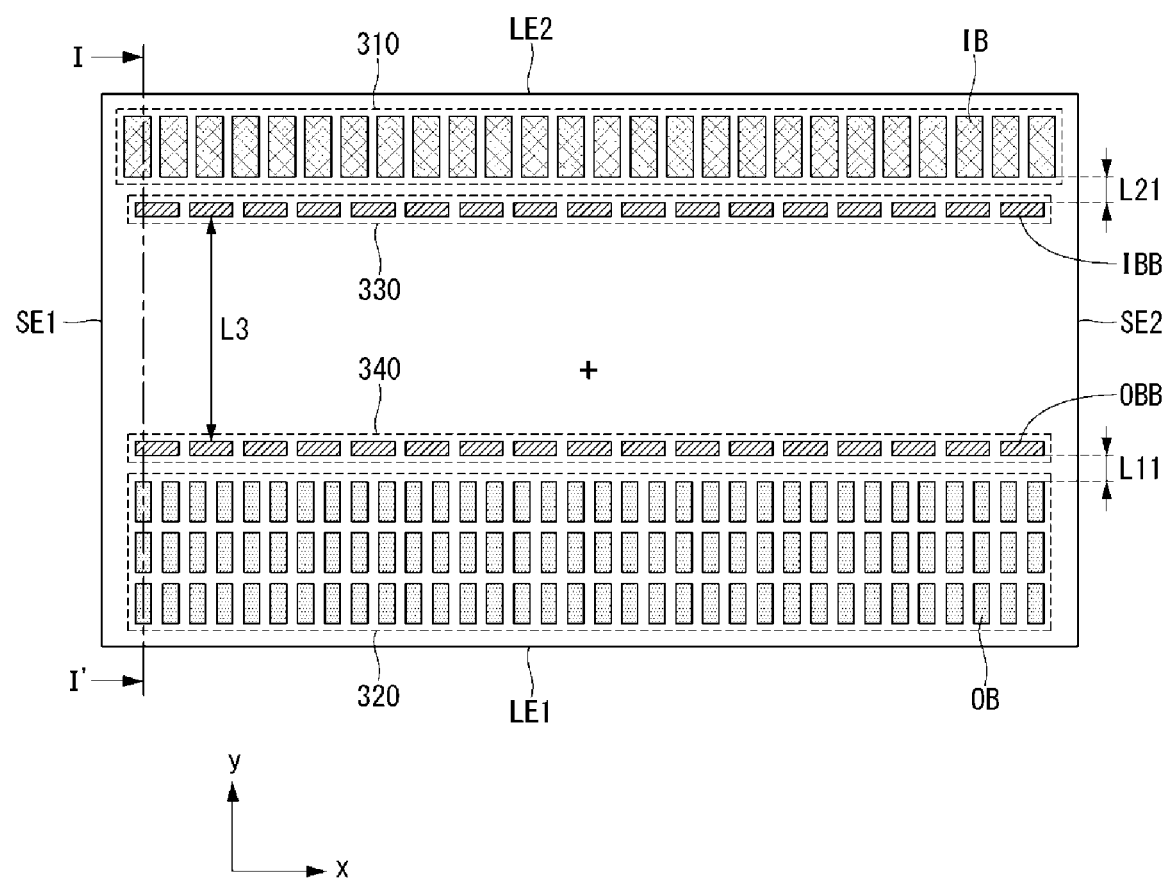
FIG. 3 is a plan view showing a bottom surface of an IC package according to a first embodiment of the disclosure.

FIG. 3 is a plan view showing the bottom surface of the IC package 30 according to a first embodiment of the disclosure. In FIG. 3, "+" indicates the center of the bottom surface of the IC package 30. Referring to FIG. 3, the bottom surface of the IC package 30 includes an input bump area 310, an output bump area 320 separated from the input bump area 310 by a predetermined distance, and first and second barrier bump areas 330 and 340 disposed between the input bump area 310 and the output bump area 320.

The bottom surface of the IC package 30 is a rectangle including four sides. The four sides include first and second sides LE1 and LE2 in the first direction x, and third and fourth sides SE1 and SE2 in the second direction y which are orthogonally connected between the first and second sides LE1 and LE2.

The input bumps IB and the output bumps OB of the IC package 30 are connected to the IC in the IC package 30. Barrier bumps IBB and OBB are floating terminals that are not connected to the IC.

The input bump area 310 is located in the upper part of the bottom surface of the IC package 30 close to the second side LE2. The input bump area 310 includes a plurality of input bumps IB. The input bumps IB transfer an input signal from the circuit board 10 to the IC of the IC package 30. Although the input bumps IB can be arranged in one line in the first direction x, as shown in FIG. 3, the disclosure is not limited thereto. The input bumps IB are connected to the input pads 50a of the display panel 100 through conductive balls of the ACF 40, as shown in FIG. 1.

The output bump area 320 is located in the lower part of the bottom surface of the IC package 30 close to the first side LE1. The output bump area 320 includes a plurality of output bumps OB. The output bumps OB transfer signals output from the IC of the IC package 30 to the signal lines of the display panel 100. Although the output bumps OB can be arranged in three lines in the first direction x, as shown in FIG. 3, the disclosure is not limited thereto. The output bumps OB are connected to the output pads 60a of the display panel 100 through conductive balls of the ACF 40, as shown in FIG. 1.

The first barrier bump area 330 is located between the input bump area 310 and the second barrier bump area 340. The first barrier bump area 330 is closer to the input bump area 310 than the second barrier bump area 340.

The first barrier bump area 330 includes a plurality of input barrier bumps IBB. The input barrier bumps IBB press the substrate 110 of the display panel 100 such that the substrate 110 does not rise in a COP bonding process and block conductive balls of the ACF which flow to the input bumps IB to prevent the conductive balls from congregating between the input bumps IB.

The second barrier bump area 340 is located between the output bump area 320 and the first barrier bump area 330. The second barrier bump area 340 is closer to the output bump area 320 than the first barrier bump area 330.

The second barrier bump area 340 includes a plurality of output barrier bumps OBB. The output barrier bumps OBB press the substrate 110 of the display panel 100 such that the substrate 110 does not rise in a COP bonding process and block conductive balls of the ACF which flow to the output bumps OB to prevent the conductive balls from congregating between output bumps OB.

Although the barrier bumps IBB and OBB of the first and second barrier bump areas 330 and 340 can be arranged in a line in first direction, the disclosure is not limited thereto. For example, the barrier bumps IBB and OBB of the first and second barrier bump areas 330 and 340 can be arranged in N lines (N is a natural number equal to or greater than 2).

In FIG. 3, "L21" represents a distance (or a shortest distance) between the input bumps IB and the input barrier bumps IBB. Here, "L11" represents a distance (or a shortest distance) between the output bumps OB and the output barrier bumps OBB. Further, "L3" denotes a distance (or a shortest distance) between the input barrier bumps IBB and the output barrier bumps OBB. Also, "+" denotes the center of the bottom face of the IC package.

Figure 5:
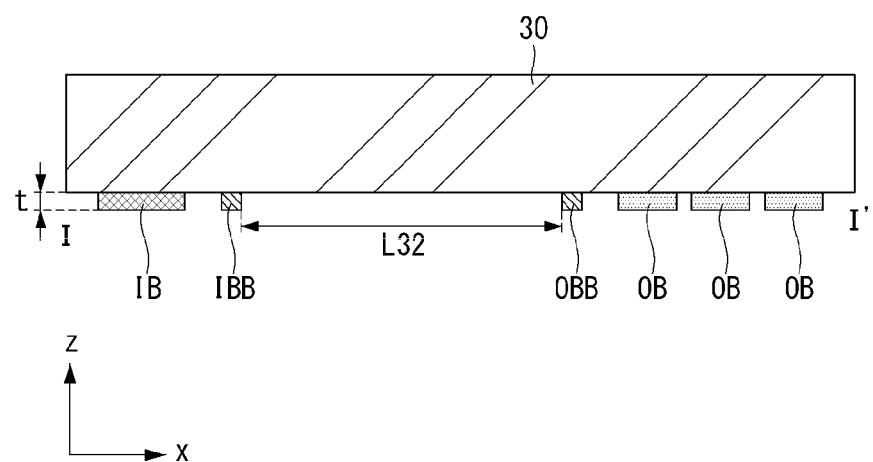
FIG. 5 is a cross-sectional view of the IC package taken along line I-I' of FIG. 4.

The input bumps IB, the output bumps OB and the barrier bumps IBB and OBB can be formed to the same thickness t, as shown in FIG. 5.

Figure 4:
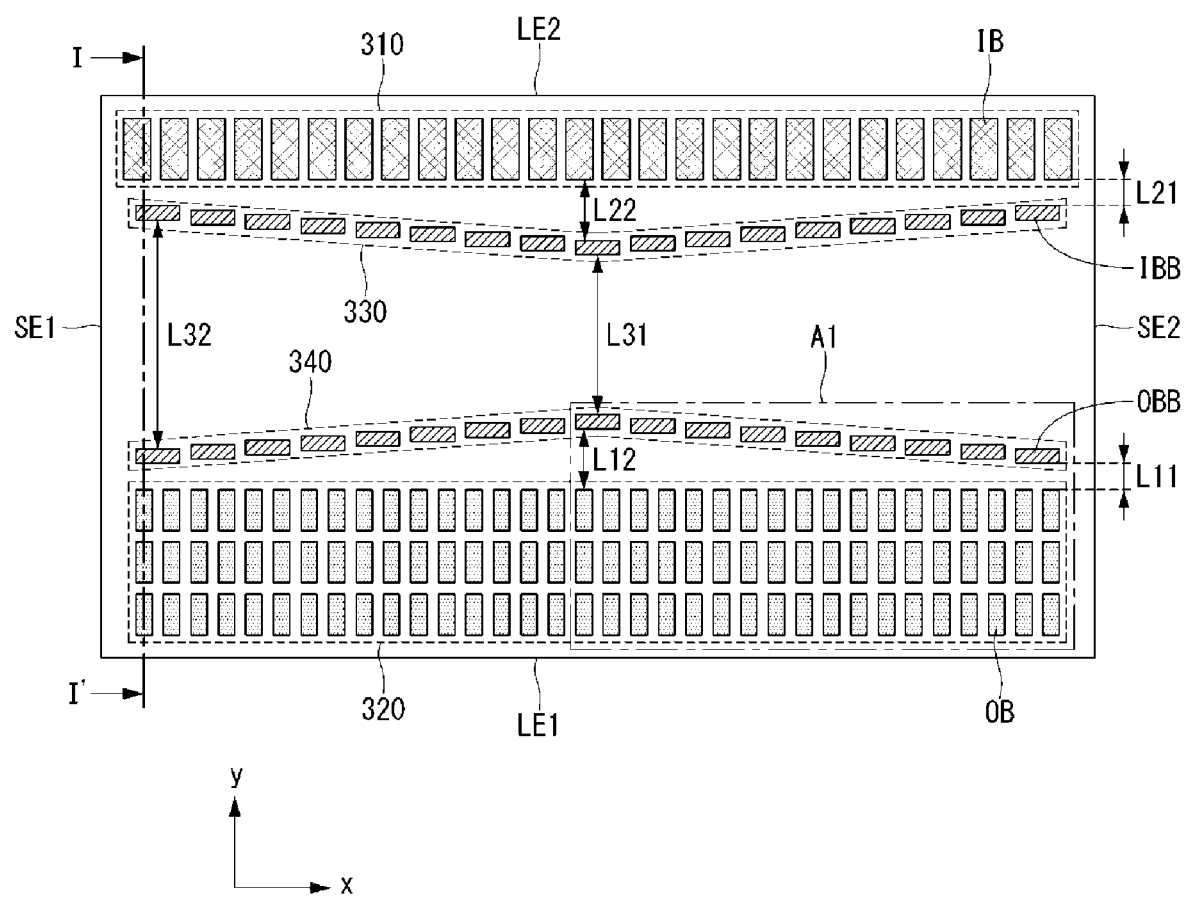
FIG. 4 is a plan view showing a bottom surface of an IC package according to a second embodiment of the disclosure.
Figure 6:
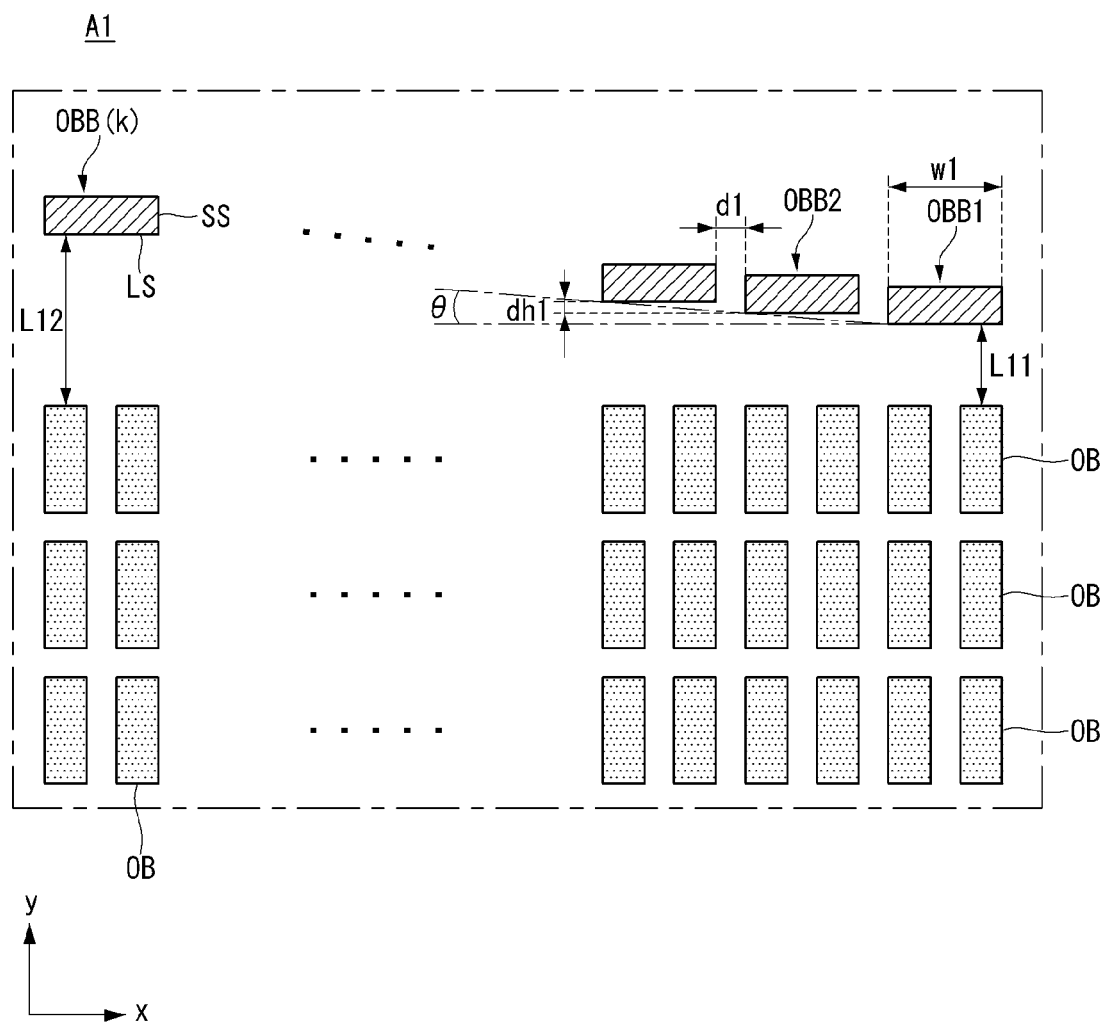
FIG. 6 is an enlarged view of a part A1 of FIG. 4.

FIG. 4 is a plan view showing the bottom surface of an IC package according to a second embodiment of the disclosure. FIG. 5 is a cross-sectional view of the IC package taken along line of FIG. 4. FIG. 6 is an enlarged view of a part A1 of FIG. 4. In description of the second embodiment, parts substantially the same as those in the first embodiment will be denoted by the same reference numbers and detailed description thereof will be omitted or brief.

Referring to FIGS. 4 to 6, the barrier bumps IBB and OBB are arranged in oblique lines bent at the center in the first and second barrier bump areas 330 and 340. The barrier bumps IBB and OBB can be arranged in a vertically and horizontally symmetrical structure.

The leftmost input barrier bumps IBB and leftmost output barrier bumps OBB are close to the third side SE1 of the IC package 30. The rightmost input barrier bumps IBB and rightmost output barrier bumps OBB are close to the fourth side SE2 of the IC package 30. The central input barrier bump IBB disposed at the center of the first barrier bump area 330 and the central output barrier bump OBB disposed at the center of the second barrier bump area 340 are close to the center of the bottom surface of the IC package 30. In FIG. 6, "OBB1" represents the rightmost output barrier bump, "OBB2" represents an output barrier bump neighboring the rightmost output barrier bump OBB1, and "OBB (k)" represents the central output barrier bump.

A distance L32 between the leftmost input barrier bump IBB and the leftmost output barrier bump OBB is substantially the same as a distance L32 between the rightmost input barrier bump IBB and the rightmost output barrier bump OBB. A distance L31 between the central input barrier bump IBB and the central output barrier bump OBB is less or smaller than the distance L32 between the left most input barrier bump IBB and the left most output barrier bump OBB. A distance L31 between the central input barrier bump IBB and the central output barrier bump OBB is less than the distance L32 between the rightmost input barrier bump IBB and the rightmost output barrier bump OBB.

A distance L21 between the leftmost input bump IB and the leftmost input barrier bump IBB is substantially the same as a distance L21 between the rightmost input bump IB and the rightmost input barrier bump IBB. A distance L22 between the central input bump IB and the central input barrier bump IBB is greater than the distance L21.

A distance L11 between the leftmost output bump OB and the leftmost output barrier bump OBB is substantially the same as a distance L11 between the rightmost output bump OB and the rightmost output barrier bump OBB. A distance L12 between the central output bump OB and the central output barrier bump OBB is greater than the distance L11.

The input barrier bumps IBB and the output barrier bumps OBB are arranged in symmetrical oblique forms and thus distances between the input barrier bumps IBB and the output barrier bumps OBB can increase with decreasing distance to the edges of the IC package 30. Conductive balls flowing from the center of the IC package 30 to the input bumps IB and the output bumps OB are blocked and the conductive balls flow along the oblique lines of the barrier bumps IBB and OBB to the outside of the IC package in a COP bonding process. In FIG. 6, "θ" denotes an angle between a reference line in the first direction x and an oblique line. The angle θ of the oblique line and the size and shape of the barrier bumps IBB and OBB can be appropriately set according to the size of the IC package 30, COP bonding process parameters, and the like.

In FIGS. 4 to 6, the barrier bumps IBB and OBB have a rectangular shape having a longitudinal side LS in the first direction x and a width-direction side SS in the second direction y. The longitudinal side LS can be set to be longer than the width-direction side SS. In FIG. 6, "w1" represents the length of the longitudinal side LS of one barrier bump.

A separation distance d1 in the first direction between neighboring output barrier bumps OBB can be designed to be the same as a separation distance between output bumps OB, but the disclosure is not limited thereto. Similarly, a separation distance in the first direction between neighboring input barrier bumps IBB can be designed to be the same as a separation distance between input bumps IB, but the disclosure is not limited thereto.

A separation distance dh1 in the second direction between neighboring output barrier bumps OBB can be set to be identical for all output barrier bumps OBB or can be set differently according to positions. Similarly, a separation distance in the second direction between neighboring input barrier bumps IBB can be set to be identical for all input barrier bumps IBB or can be set differently according to positions.

Figure 7:
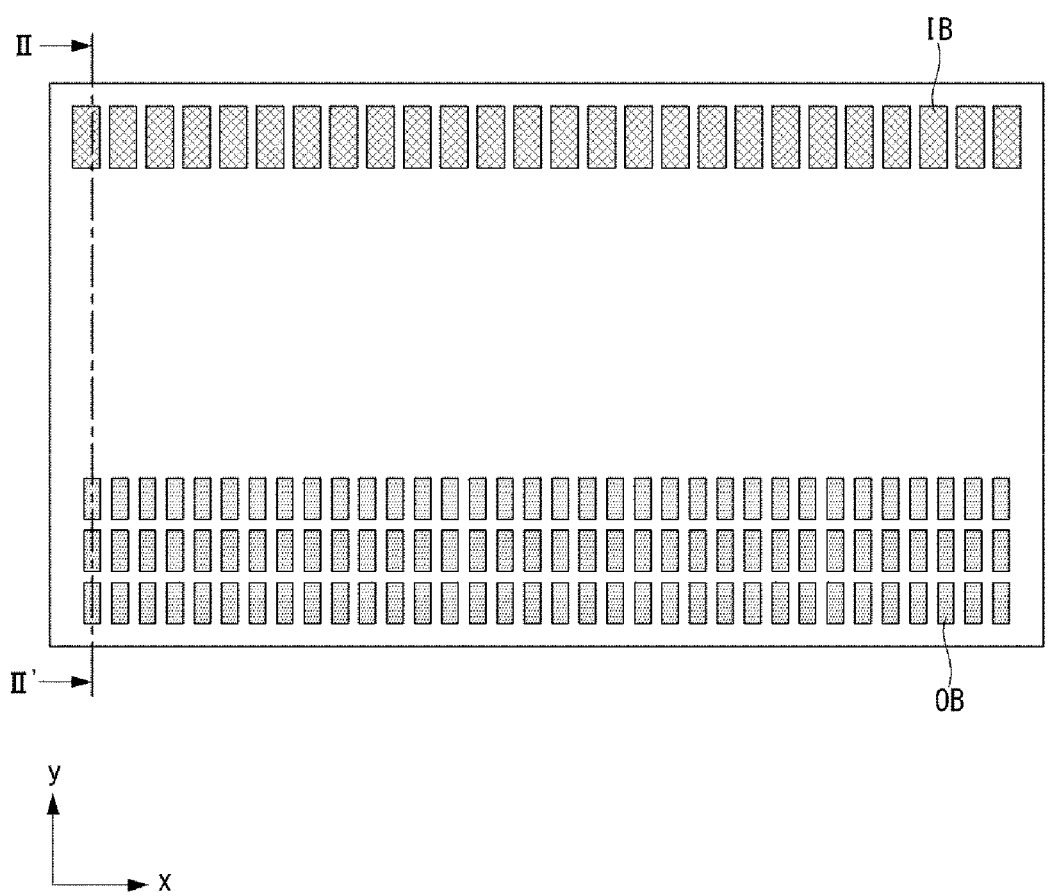
FIG. 7 is a diagram showing the bottom surface of an IC package of a comparative example which does not include barrier bumps.
Figure 8:
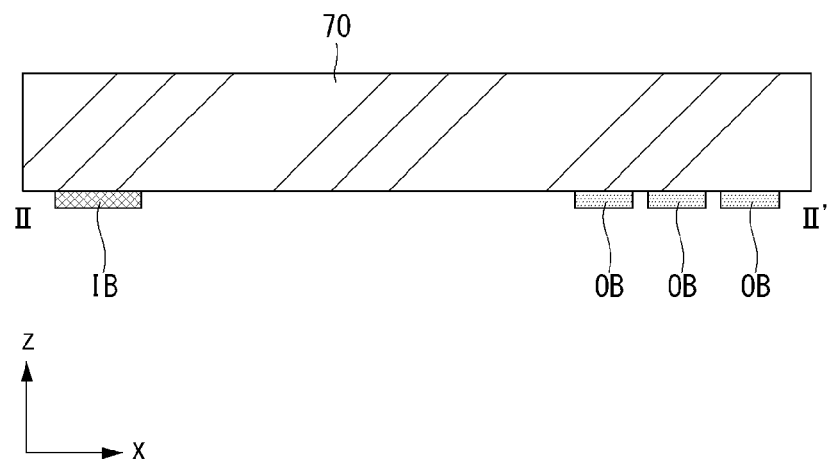
FIG. 8 is a cross-sectional view of the IC package taken along line II-II' of FIG. 7.
Figure 9:
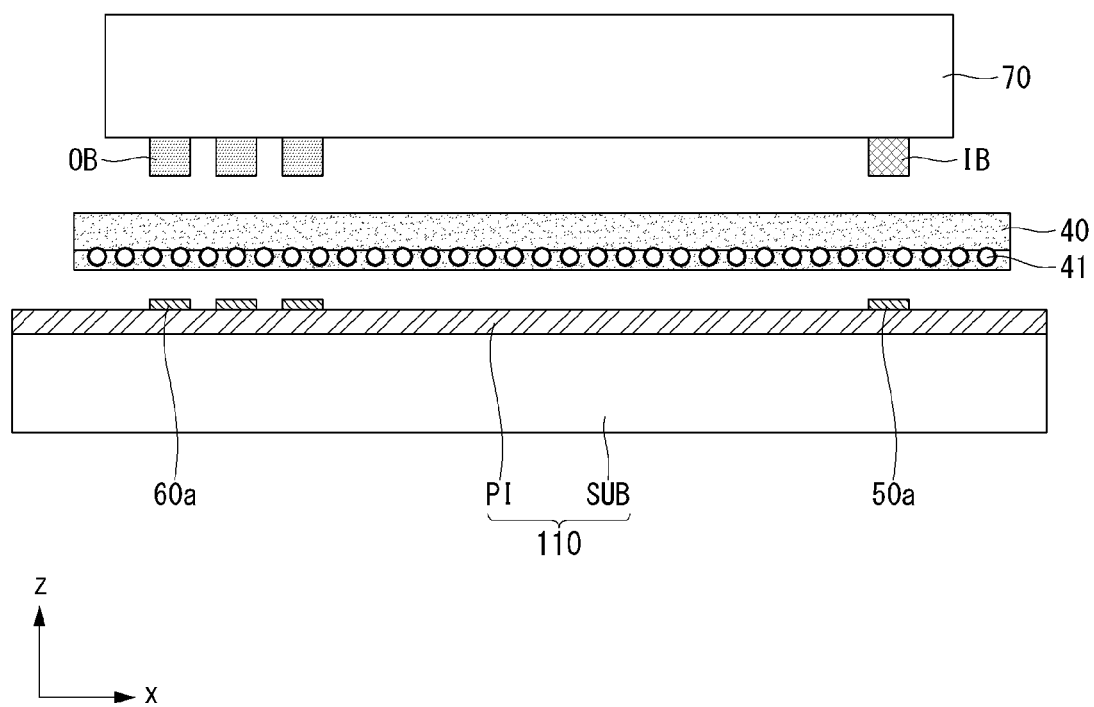
FIG. 9 is a diagram showing an ACF and an IC package aligned on a substrate of a display panel in a COP bonding process.
Figure 10:
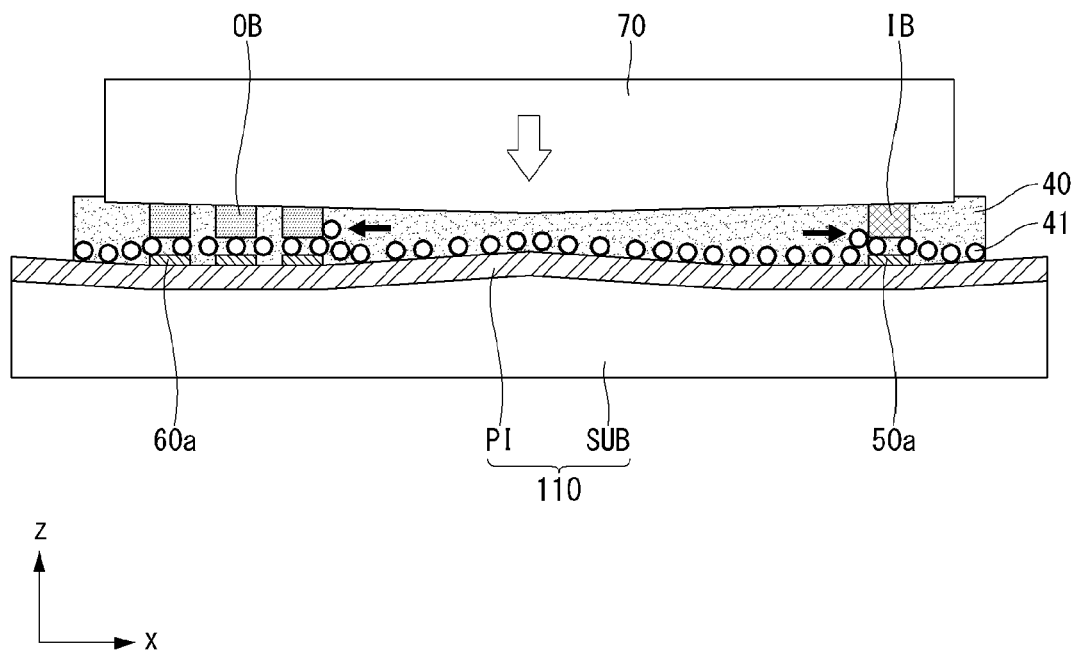
FIG. 10 is a cross-sectional view showing an example of short-circuit generated when the IC package is pressed against the substrate on the substrate of the display panel in the COP bonding process.
Figure 11:
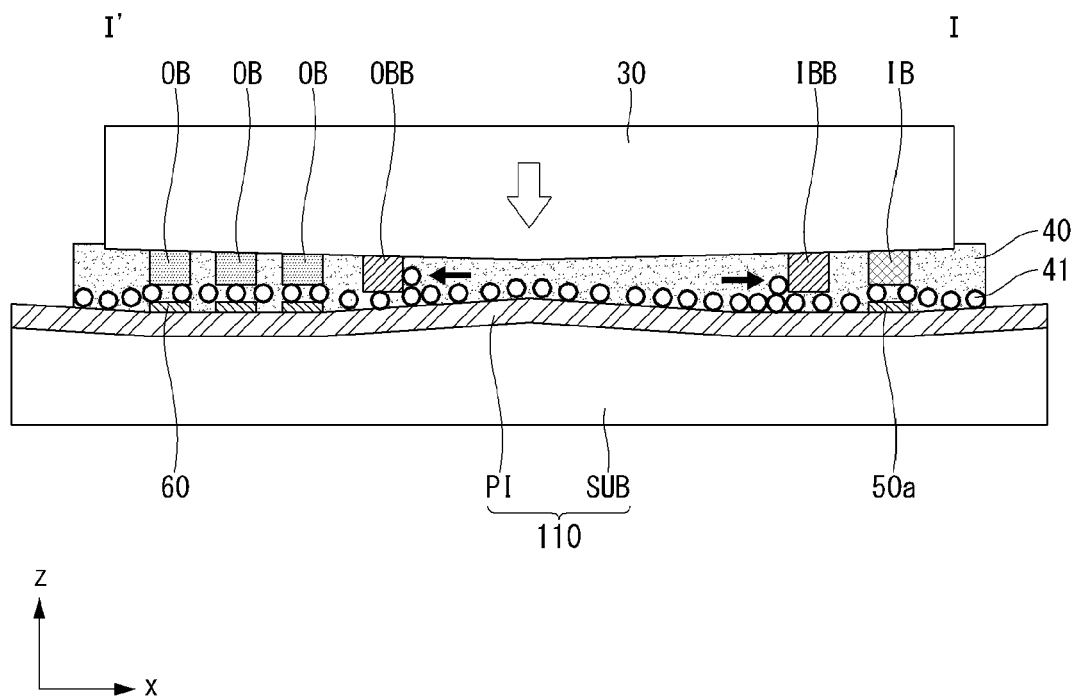
FIG. 11 is a cross-sectional view showing an example in which the IC package according to the first and second embodiments of the disclosure is pressed against a substrate in a COP bonding process.

FIG. 7 is a diagram showing the bottom surface of an IC package of a comparative example which does not include barrier bumps. FIG. 8 is a cross-sectional view of the IC package taken along line II-II' of FIG. 7. FIG. 9 is a diagram showing an ACF and an IC package aligned on a substrate of a display panel in a COP bonding process. FIG. 10 is a cross-sectional view showing an example of short-circuit generated when the IC package is pressed against the substrate on the substrate of the display panel in the COP bonding process. FIG. 11 is a cross-sectional view showing an example in which the IC package according to the first and second embodiments of the disclosure is pressed against a substrate in a COP bonding process.

Effects and advantages of preventing short-circuiting between bumps in a COP bonding process according to the bump structure of an IC package of the disclosure will be described in comparison with a comparative example with reference to FIGS. 7 to 11.

Referring to FIGS. 7 to 10, an IC package 70 of the comparative example does not include bumps other than input bumps IB and output bumps OB.

The substrate 110 of a display panel can include a back plate substrate SUB and a flexible substrate PI disposed on the back plate substrate SUB. The back plate substrate SUB can be a polyethylene terephthalate (PET) substrate. The flexible substrate PI can be a polyimide (PI) film substrate. The pads 50a and 60a are formed on the flexible substrate PI.

The ACF 40 is aligned on the substrate 110 and the IC package 70 of the comparative example is aligned thereon in a COP bonding process. Subsequently, the temperature of a processing chamber is increased and the IC package 70 is pressed against the substrate 110 in the COP bonding process. The input bumps IB of the IC package 70 are electrically connected to the pads 50a through conductive balls 41 of the ACF 40. The output bumps OB are electrically connected to the pads 60a through conductive balls 41 of the ACF 40.

When the substrate 110 to which heat is applied is pressed by the IC package 70, the center of the IC mounting surface 111 of the substrate 110 rises, as shown in FIG. 10. Accordingly, conductive balls positioned at the center of the IC mounting surface 111 can flow to the edge of the IC mounting surface 111 and congregate on the input bumps IB and the output bumps OB while the IC package 70 is pressed against the substrate 110. As a result, neighboring input bumps IB are shorted each other due to conductive balls 41 congregating therebetween. Also, neighboring output bumps OB are shorted each other due to conductive balls 41 congregating therebetween.

In contrast, the IC package 30 of the present disclosure further includes the first and second barrier bump areas 330 and 340 disposed between the input bump area 310 and the output bump area 320, as shown in FIGS. 3 and 4. The input barrier bumps IBB of the first barrier bump area 330 are disposed in a way in which the conductive balls 41 flow from the center of the IC mounting surface 111 to the input bumps IB in a COP bonding process to block the conductive balls 41, as shown in FIG. 11. Similarly, the output barrier bumps OBB of the second barrier bump area 340 are disposed in a way in which the conductive balls 41 flow from the center of the IC mounting surface 111 to the output bumps OB in a COP bonding process to block the conductive balls 41, as shown in FIG. 11. As a result, the barrier bumps IBB and OBB can prevent short-circuiting of the input/output bumps IB and OB in a COP bonding process.

Figure 12:
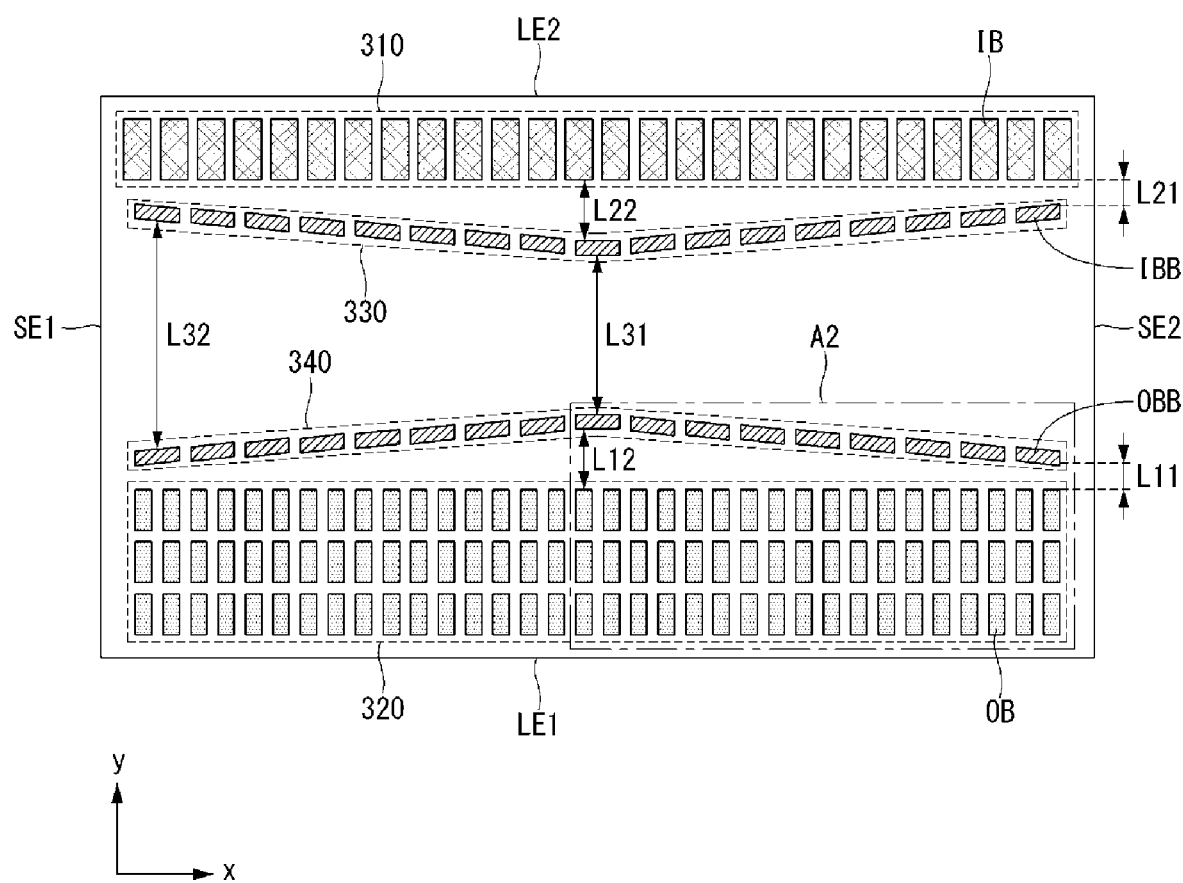
FIG. 12 is a plan view showing a bottom surface of an IC package according to a third embodiment of the disclosure.
Figure 13:
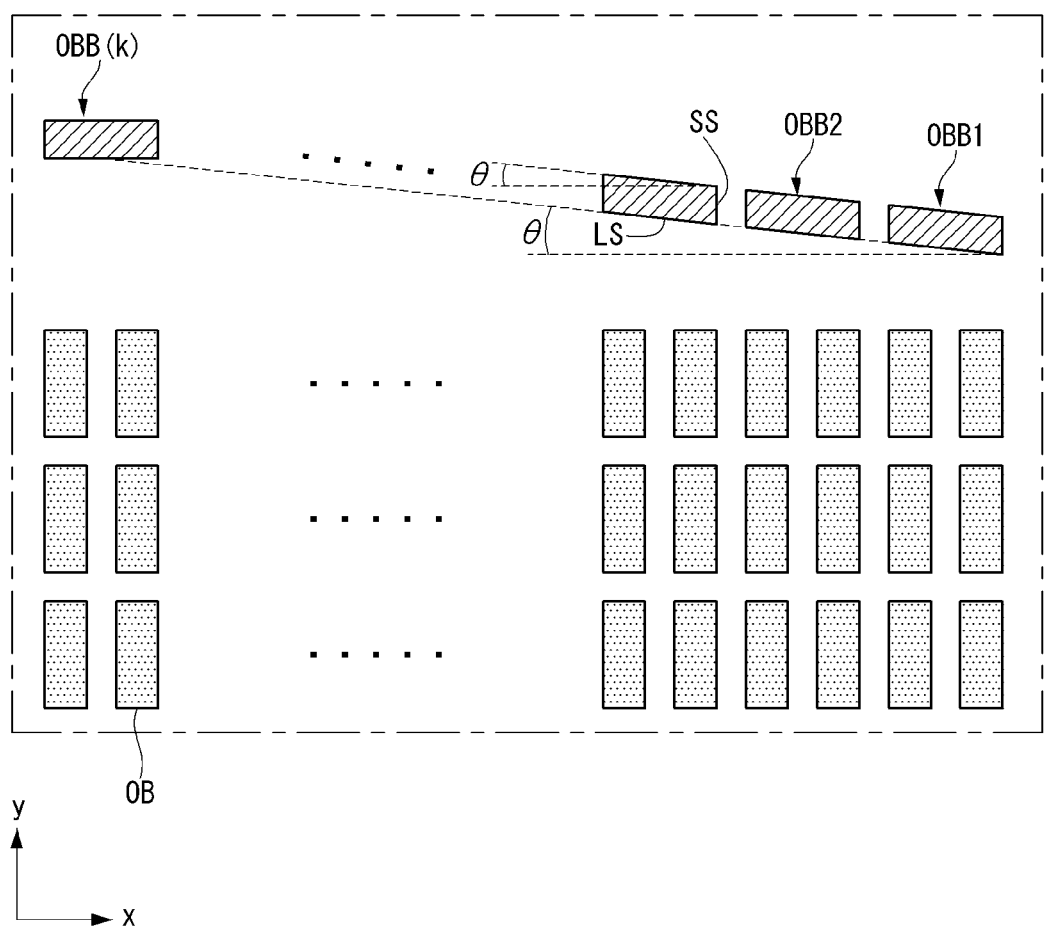
FIG. 13 is an enlarged view of a part A2 of FIG. 12.

FIG. 12 is a plan view showing the bottom surface of an IC package according to a third embodiment of the disclosure. FIG. 13 is an enlarged view of a part A2 of FIG. 12. In description of the third embodiment, parts substantially the same as those in the above-described embodiments will be denoted by the same reference numbers and detailed description thereof will be omitted or brief.

Referring to FIGS. 12 and 13, the barrier bumps IBB and OBB are arranged in oblique lines bent at the center in the first and second barrier bump areas 330 and 340. The barrier bumps IBB and OBB can be arranged in a vertically and horizontally symmetrical structure.

The longitudinal sides LS of the barrier bumps IBB and OBB are inclined by the angle θ between the reference line in the first direction x and the oblique line. The width-direction sides SS of the barrier bumps IBB and OBB are parallel to the second direction y. Accordingly, the barrier bumps IBB and OBB have a parallelogram shape.

Figure 14:
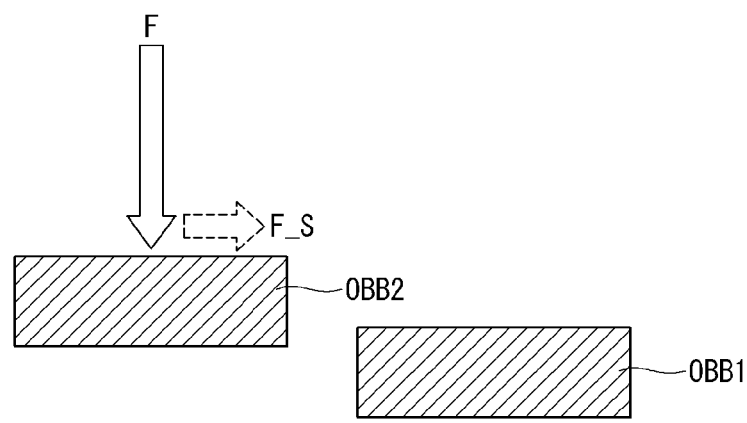
FIG. 14 is a diagram showing a force applied to a barrier bump when conductive balls flow and collide with barrier bumps shown in FIG. 4 in a COP bonding process.
Figure 14:
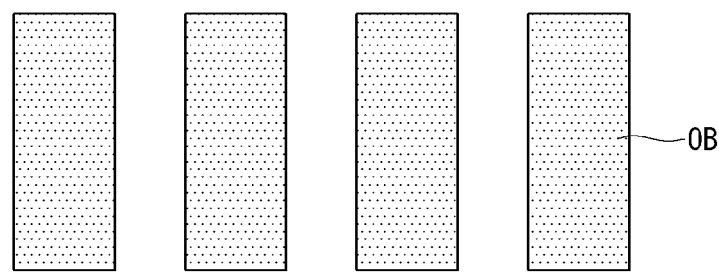
Figure 14:
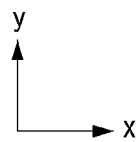
Figure 15:
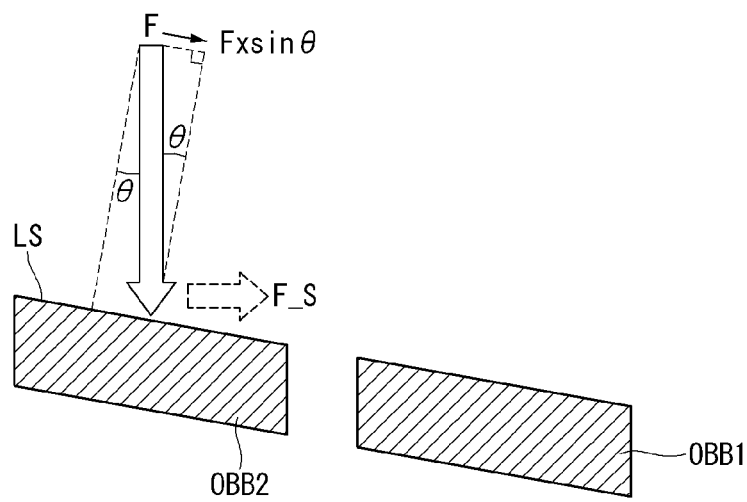
FIG. 15 is a diagram showing a force applied to a barrier bump when conductive balls flow and collide with barrier bumps shown in FIG. 12 in a COP bonding process.
Figure 15:
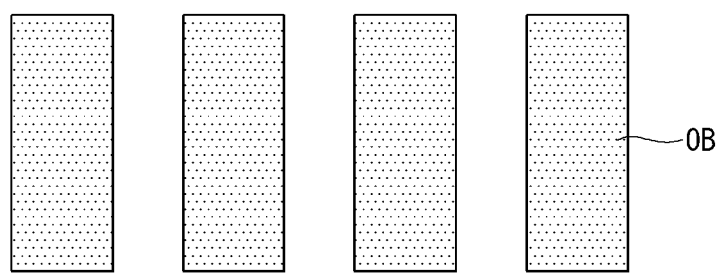
Figure 15:
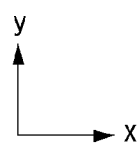

FIG. 14 is a diagram showing a force applied to a barrier bump when conductive balls flow and collide with barrier bumps shown in FIG. 4 in a COP bonding process, FIG. 15 is a diagram showing a force applied to a barrier bump when conductive balls flow and collide with barrier bumps shown in FIG. 12 in a COP bonding process.

Referring to FIGS. 14 and 15, when an external force F caused by flow of the conductive balls 41 is applied to the longitudinal sides LS of the barrier bumps OBB1 and OBB2, a force F_s of "F sin Θ" is applied to the conductive balls 41 at collision of the conductive balls 41 with the barrier bumps OBB1 and OBB2. Here, "Θ" is the angle of the force F applied to the longitudinal sides LS of the barrier bumps OBB with respect to a line vertical to the longitudinal side LS.

In the case of the barrier bumps IBB and OBB shown in FIG. 4, "F sin Θ" is "0" because Θ=0° as shown in FIG. 14.

In the case of the barrier bumps IBB and OBB shown in FIG. 12, "F sin Θ" has a value in the range of "0<F sin Θ<F" because Θ is greater than 0° and less than 90°. Accordingly, the shape of the barrier bumps IBB and OBB shown in FIG. 12 is more advantageous to lead flow of the conductive balls 41 to the edge of the IC mounting surface 111.

In FIG. 15, as Θ increases, F sin Θ increases to cause the conductive balls 41 to move to the edge of the IC mounting surface more rapidly. However, the central output barrier bump OBB[k] becomes close to the central input barrier bump IBB of the IC package 30. Accordingly, Θ needs to be appropriately designed such that the central output barrier bump OBB[k] does not come into contact with the central input barrier bump IBB.

Figure 16:
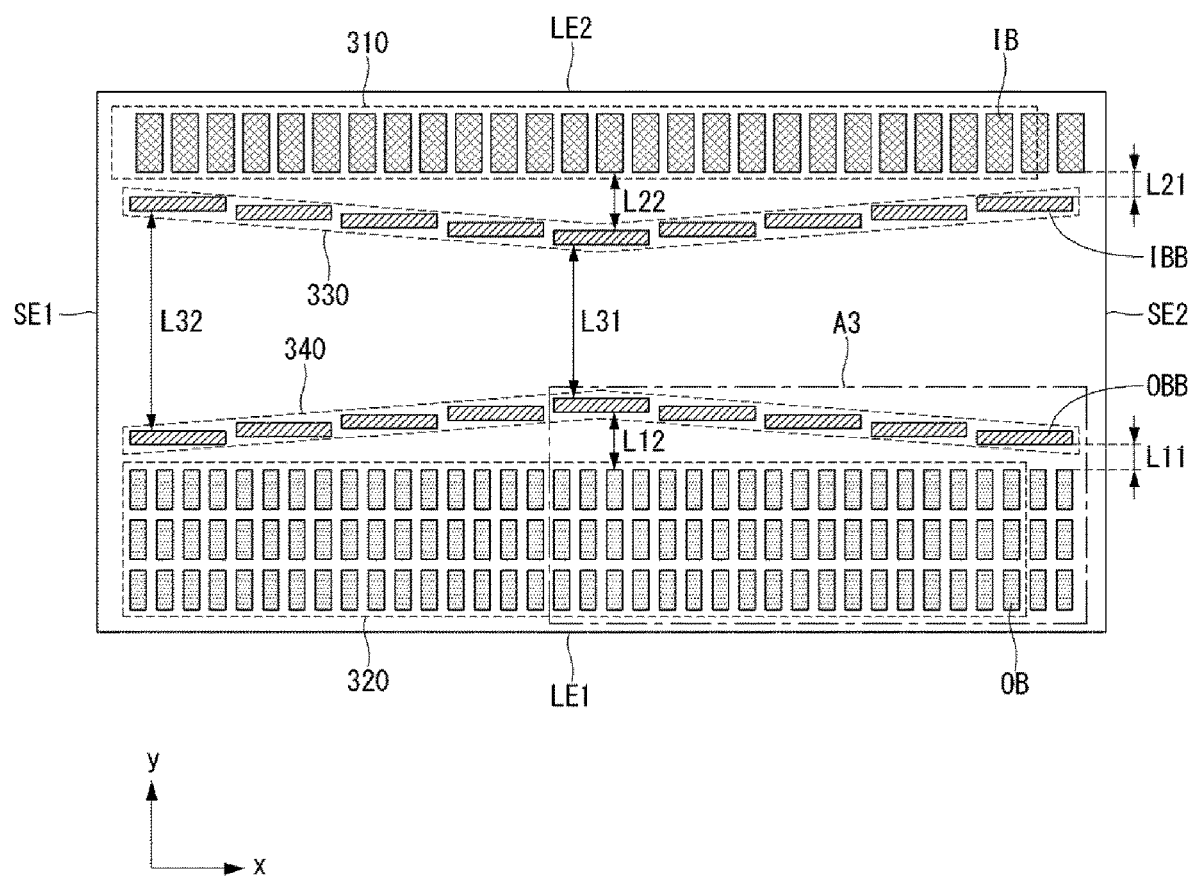
FIG. 16 is a plan view showing a bottom surface of an IC package according to a fourth embodiment of the disclosure.
Figure 17:
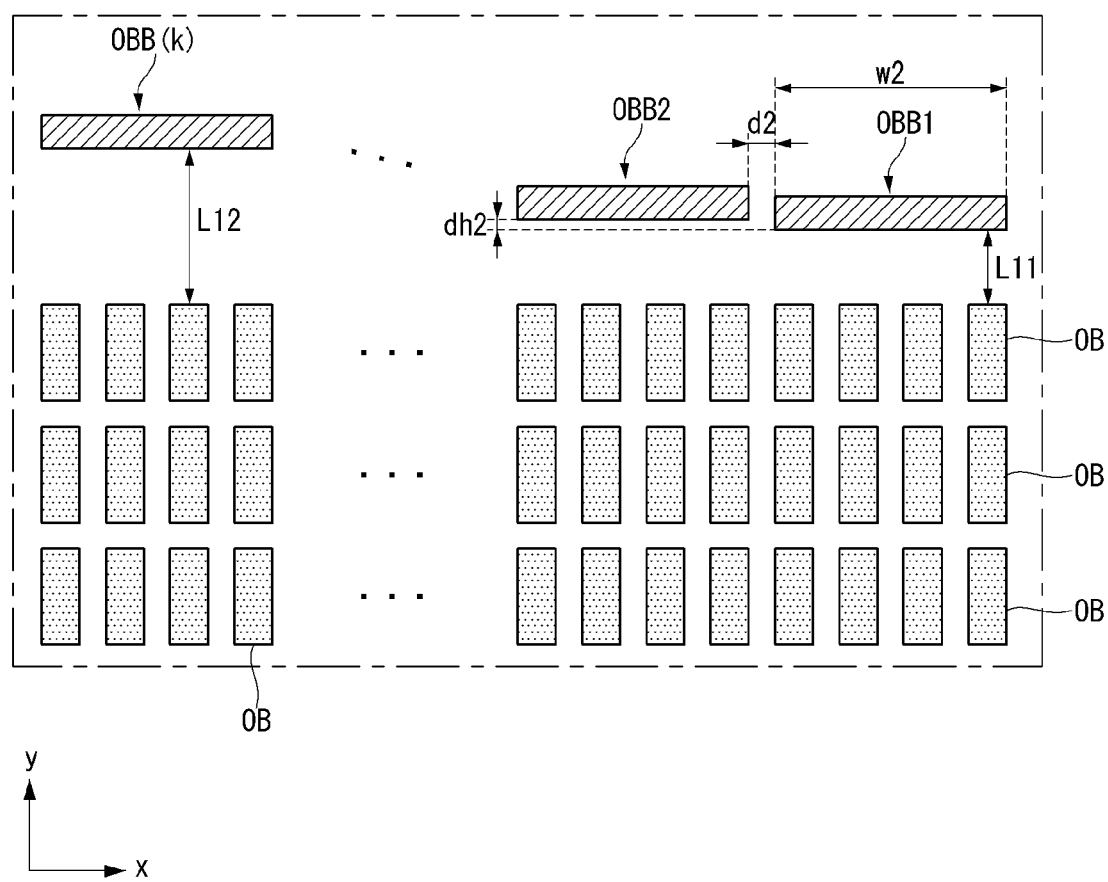
FIG. 17 is an enlarged view of a part A3 of FIG. 16.

FIG. 16 is a plan view showing the bottom surface of an IC package according to a fourth embodiment of the disclosure. FIG. 17 is an enlarged view of a part A3 of FIG. 16. In description of the fourth embodiment, parts substantially the same as those in the above-described embodiments will be denoted by the same reference numbers and detailed description thereof will be omitted or brief.

Referring to FIGS. 16 and 17, the barrier bumps IBB and OBB are arranged in oblique lines bent at the center in the first and second barrier bump areas 330 and 340. The barrier bumps IBB and OBB can be arranged in a vertically and horizontally symmetrical structure.

The barrier bumps IBB and OBB have a longitudinal side LS in the first direction x and a width-direction side SS in the second direction y. The longitudinal side LS can be set to be longer than the width-direction side SS. In FIG. 17, "w2" represents the length of the longitudinal side LS of one barrier bump.

The longitudinal length w2 of the barrier bumps IBB and OBB shown in FIG. 16 is greater than that of the barrier bumps shown in FIG. 4. When the longitudinal length of the barrier bumps IBB and OBB increases, it is more advantageous to prevent congregation of the conductive balls 41 around the input bumps IB and the output bumps OB. However, when w2 increases, the number of conductive balls 41 colliding with the barrier bumps IBB and OBB increases and thus the external force F increases. This can cause the barrier bumps IBB and OBB to easily collapse. Accordingly, w2 needs to be appropriately set in consideration of the conductive ball blocking effect and the durability and stability of the barrier bumps IBB and OBB.

Figure 18:
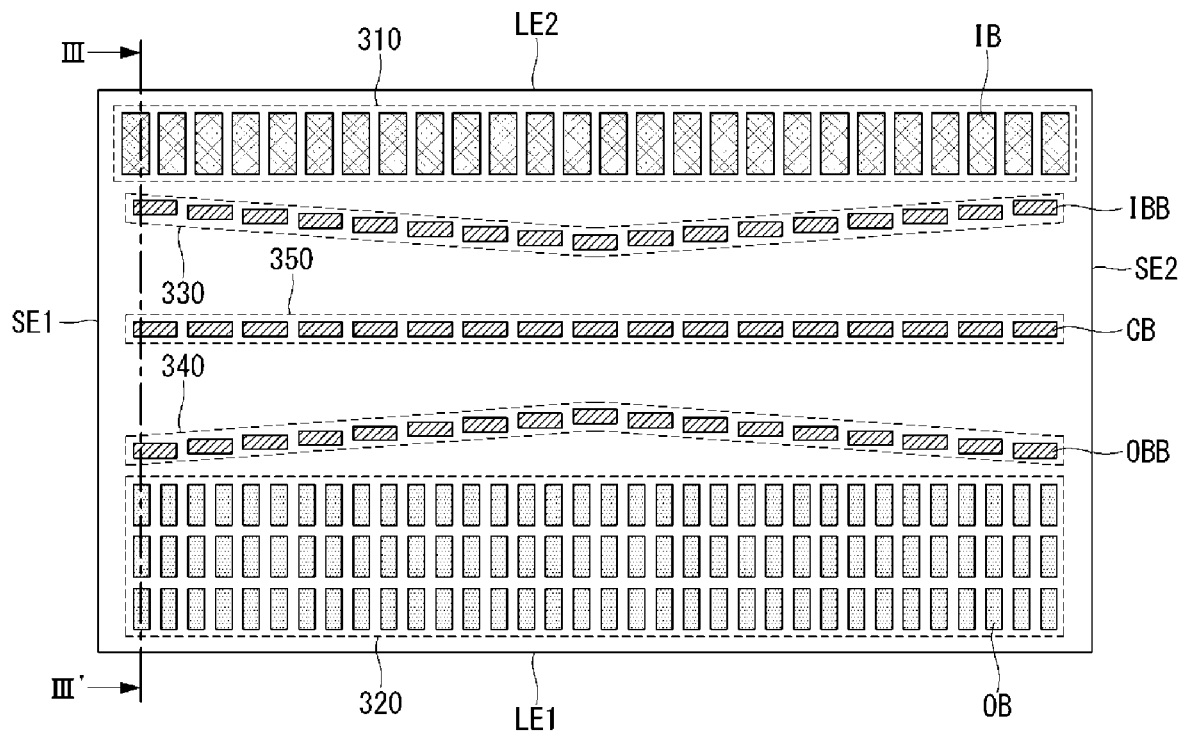
FIG. 18 is a plan view showing the bottom surface of an IC package according to a fifth embodiment of the disclosure.
Figure 19:
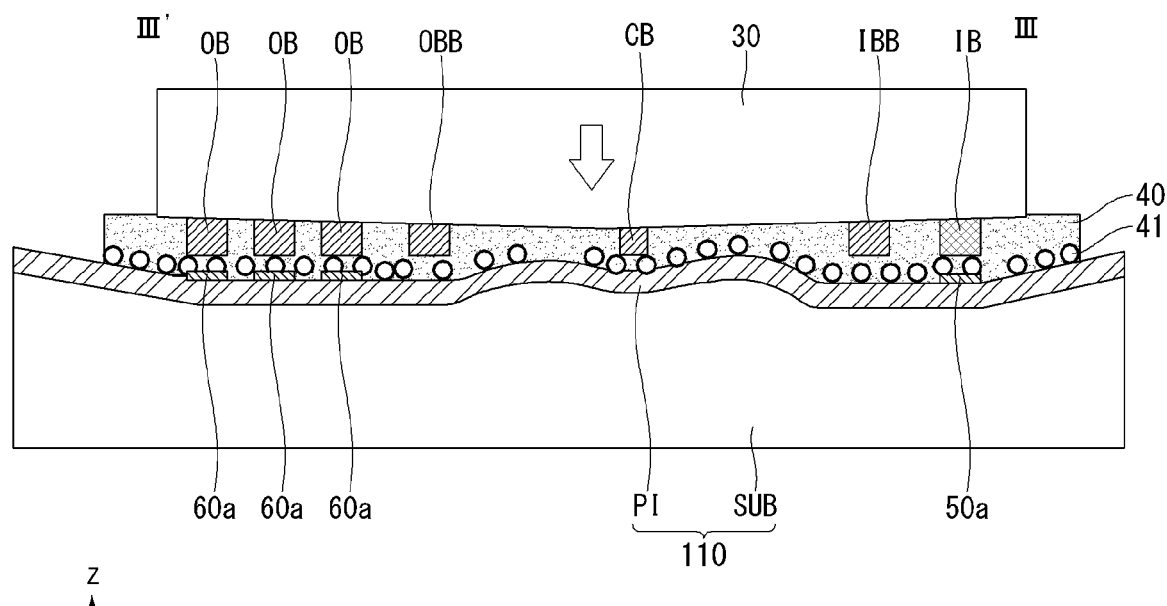
FIG. 19 is a cross-sectional view of the IC package taken along line of FIG. 18.

FIG. 18 is a plan view showing the bottom surface of an IC package according to a fifth embodiment of the disclosure. FIG. 19 is a cross-sectional view of the IC package 30 taken along line of FIG. 18. The IC package 30 is pressed against the substrate 110 of the display panel 100 in a COP bonding process, as shown in FIG. 19. In description of the fifth embodiment, parts substantially the same as those in the above-described embodiments will be denoted by the same reference numbers and detailed description thereof will be omitted or brief.

Referring to FIGS. 18 and 19, the bottom surface of the IC package 30 includes the input bump area 310, the output bump area 320 separated from the input bump area 310 by a predetermined distance, the first and second barrier bump areas 330 and 340 disposed between the input bump area 310 and the output bump area 320, and a third barrier bump area 350 disposed between the first barrier bump area 330 and the second barrier bump area 340.

The input bump area 310 is located in the upper part of the bottom surface of the IC package 30 close to the second side LE2. The input bump area 310 includes a plurality of input bumps IB. Although the input bumps IB can be arranged in one line in the first direction x, the disclosure is not limited thereto. The input bumps IB are connected to the input pads 50a of the display panel 100 through the conductive balls 41.

The output bump area 320 is located in the lower part of the bottom surface of the IC package 30 close to the first side LE1. The output bump area 320 includes a plurality of output bumps OB. Although the output bumps OB can be arranged in three lines in the first direction x, the disclosure is not limited thereto. The output bumps OB are connected to the output pads 60a of the display panel 100 through the conductive balls 41.

The first barrier bump area 330 is located between the input bump area 310 and the third barrier bump area 350. The first barrier bump area 330 includes a plurality of input barrier bumps IBB. The input barrier bumps IBB press the substrate 110 of the display panel 100 such that the substrate 110 does not rise in a COP bonding process and block conductive balls 41 which flow to the input bumps IB to prevent the conductive balls from congregating on the input bumps IB.

The second barrier bump area 340 is located between the output bump area 320 and the third barrier bump area 350. The second barrier bump area 340 includes a plurality of output barrier bumps OBB. The output barrier bumps OBB press the substrate 110 of the display panel 100 such that the substrate 110 does not rise in a COP bonding process and block conductive balls 41 which flow to the output bumps OB to prevent the conductive balls from congregating on the output bumps OB.

The third barrier bump area 350 is located between the first barrier bump area 330 and the second barrier bump area 340. The third barrier bump area 350 includes a plurality of central barrier bumps CB. The central barrier bumps CB press center of the substrate 110 of the display panel 100 such that the substrate 110 does not rise in a COP bonding process. Since the center of the IC mounting surface of the substrate 110 does not rise according to the central barrier bumps CB, flow of the conductive balls 41 at the center of the IC mounting surface is inhibited. Accordingly, the number of conductive balls 41 flowing from the center of the IC mounting surface to the first and second barrier bump areas 330 and 340 can be reduced.

Since the barrier bumps IBB, OBB and CB of the first to third barrier bump areas 330, 340 and 350 are floating terminals to which any electrical signal is not applied, the barrier bumps IBB, OBB and CB do not affect input/output signals of the IC package even if they come into contact with the conductive balls 41.

Figure 20:
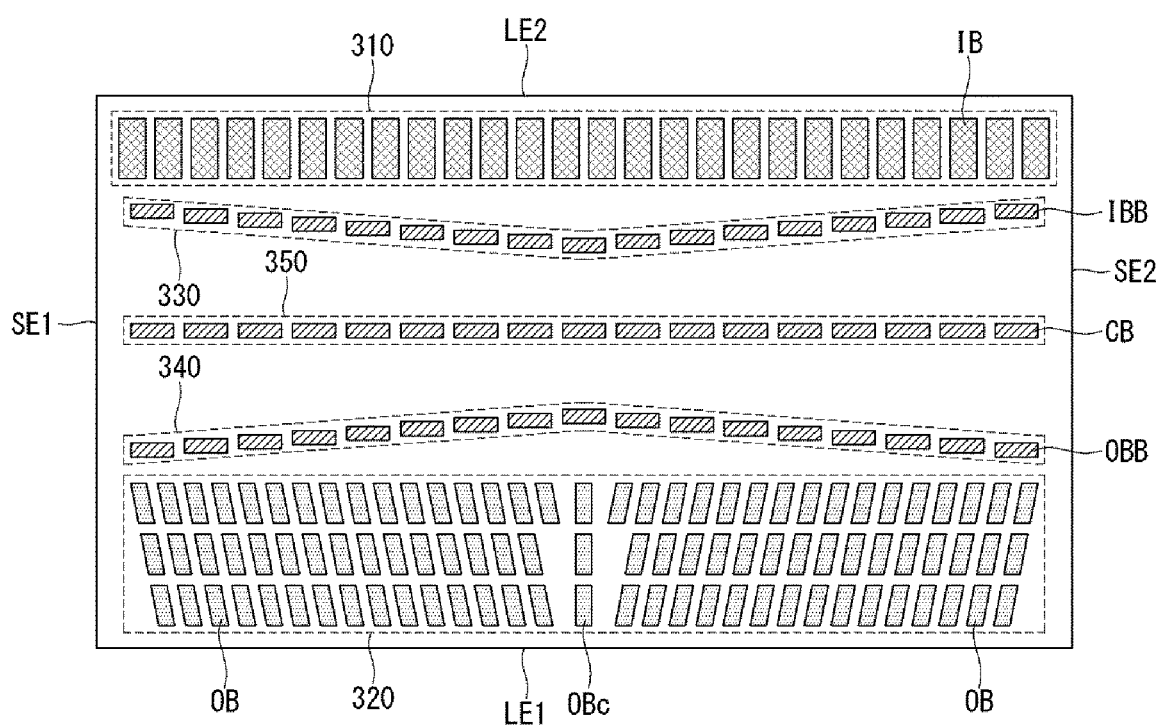
FIG. 20 is a diagram showing another example of output bumps.
Figure 21:
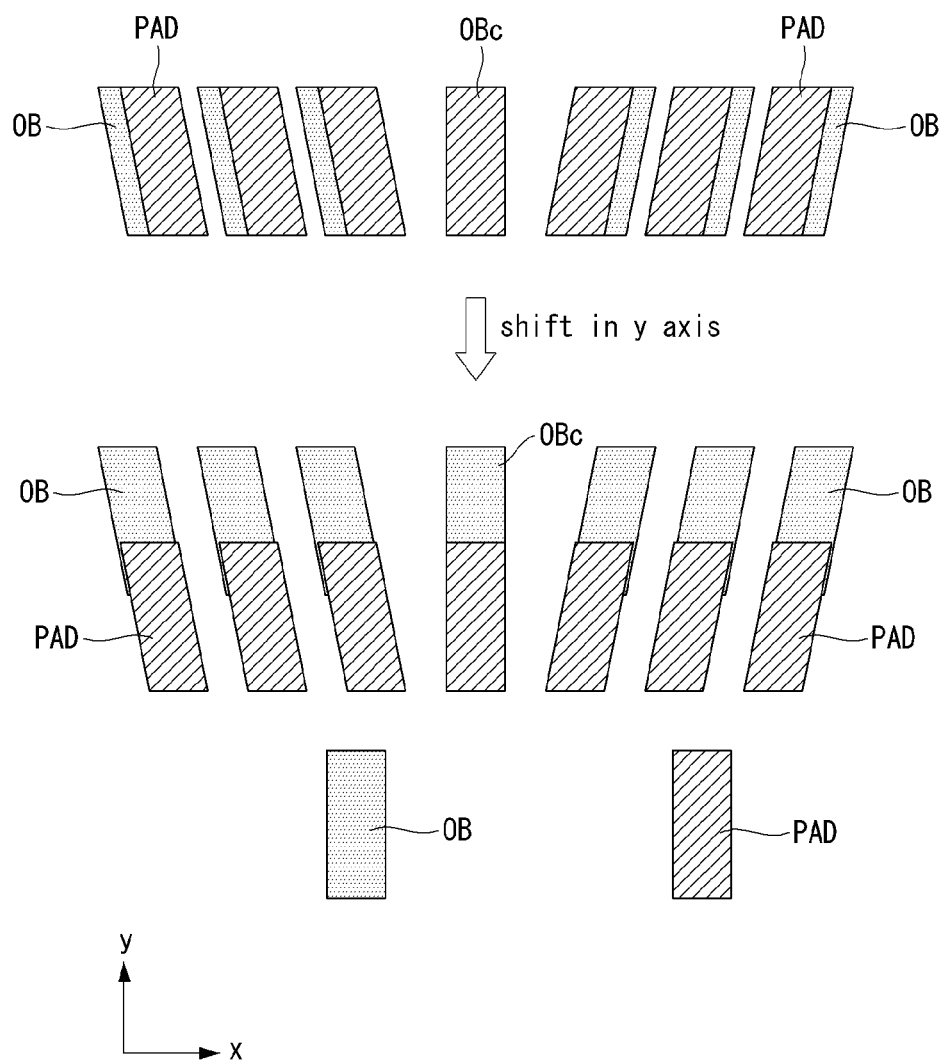
FIG. 21 is a diagram showing a method of bonding the output bumps shown in FIG. 20 to pads of a display panel.

FIG. 20 is a diagram showing another example of output bumps according to the disclosure. FIG. 21 is a diagram showing a method of bonding the output bumps shown in FIG. 20 to pads of a display panel. In FIG. 21, "PAD" denotes the output pads 60a of the display panel 100.

Referring to FIGS. 20 and 21, output bumps include central output bumps OBc and output bumps OB arranged symmetrically on the basis of the central output bumps OBc. The output bumps OB and OBc are one-to-one connected to the output pads PAD of the display panel 100 through the conductive balls 41 of the ACF 40.

The IC package 30 and the display panel 100 can have different amounts of thermal expansion in a COP bonding process. In this case, misalignment between the output bumps OB and the output pads PAD of the display panel 100 occurs and increases with decreasing distance to the edge of the IC package 30. A thermal calibration amount that can calibrate a difference between coefficients of thermal expansion can be applied to a pitch between output pads PAD of the display panel 100. Even when the thermal calibration amount is applied to the pitch between output pads PAD, misalignment between the output bumps OB and the output pads PAD can occur due to individual tolerances of the output bumps OB and the output pads PAD.

The output bumps OB can be disposed in a radial structure at a predetermined angle with respect to the first and second directions x and y, as shown in FIG. 20. In this case, when the IC package 30 or the display panel 100 is shifted in the second direction y in a COP bonding process, the problem of misalignment between the output bumps OB and the output pads PAD can be solved. The central output bumps OBc are aligned with output pads PAD disposed at the center of the IC mounting surface 111. The central output bumps OBc serve as output terminals for transferring output signals of the IC package 30 to the display panel 100 and alignment marks for alignment between the IC package 30 and the display panel 100.

Figure 22:
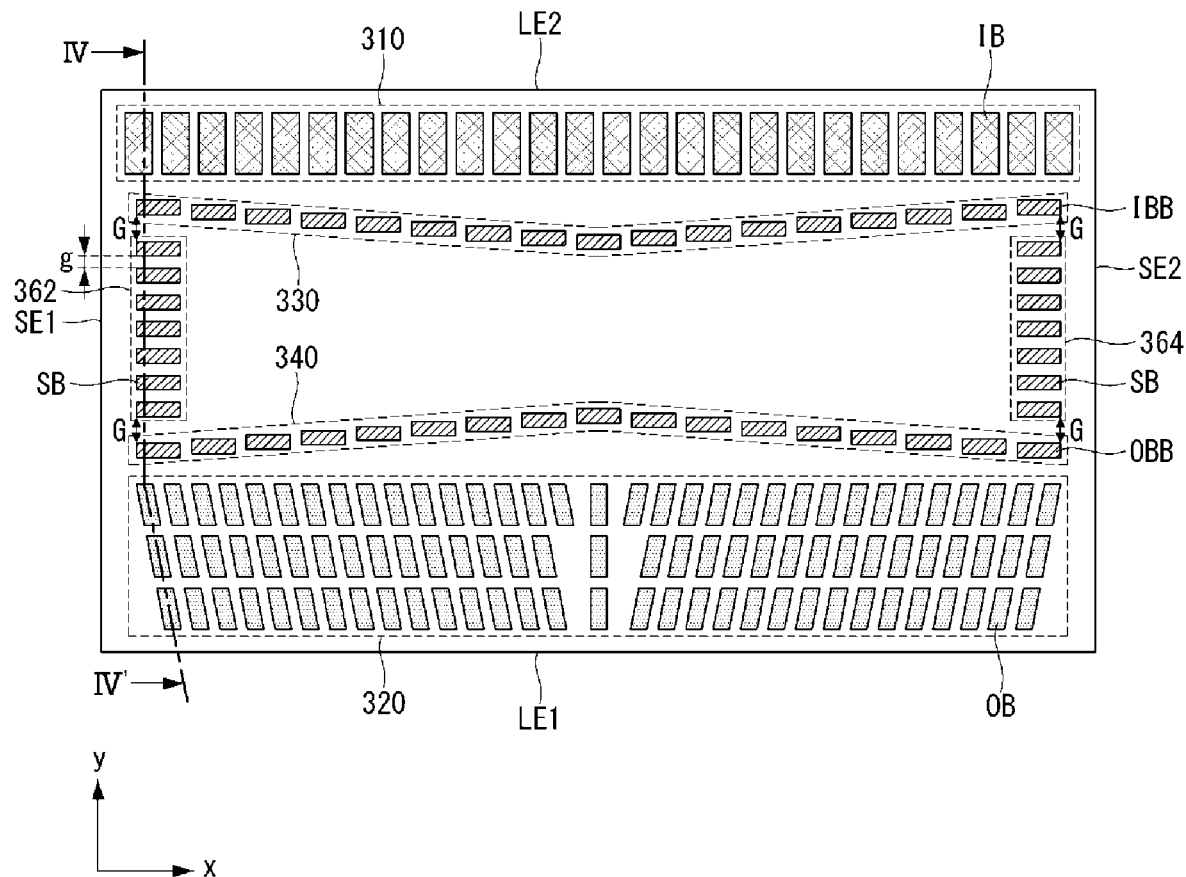
FIG. 22 is a plan view showing a bottom surface of an IC package according to a sixth embodiment of the disclosure.
Figure 23:
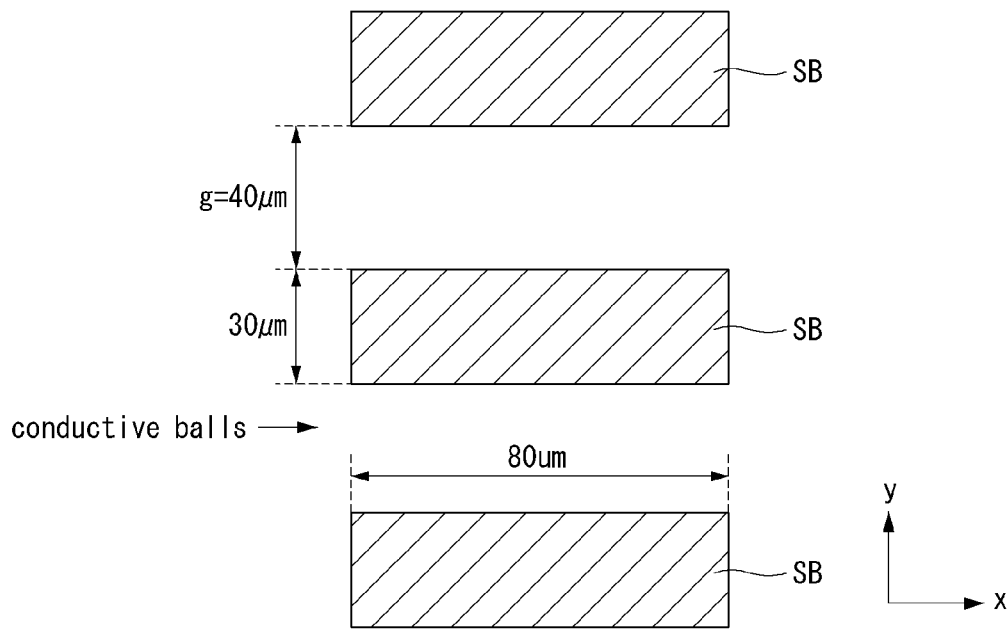
FIG. 23 is an enlarged view of side barrier bumps shown in FIG. 22.
Figure 24:
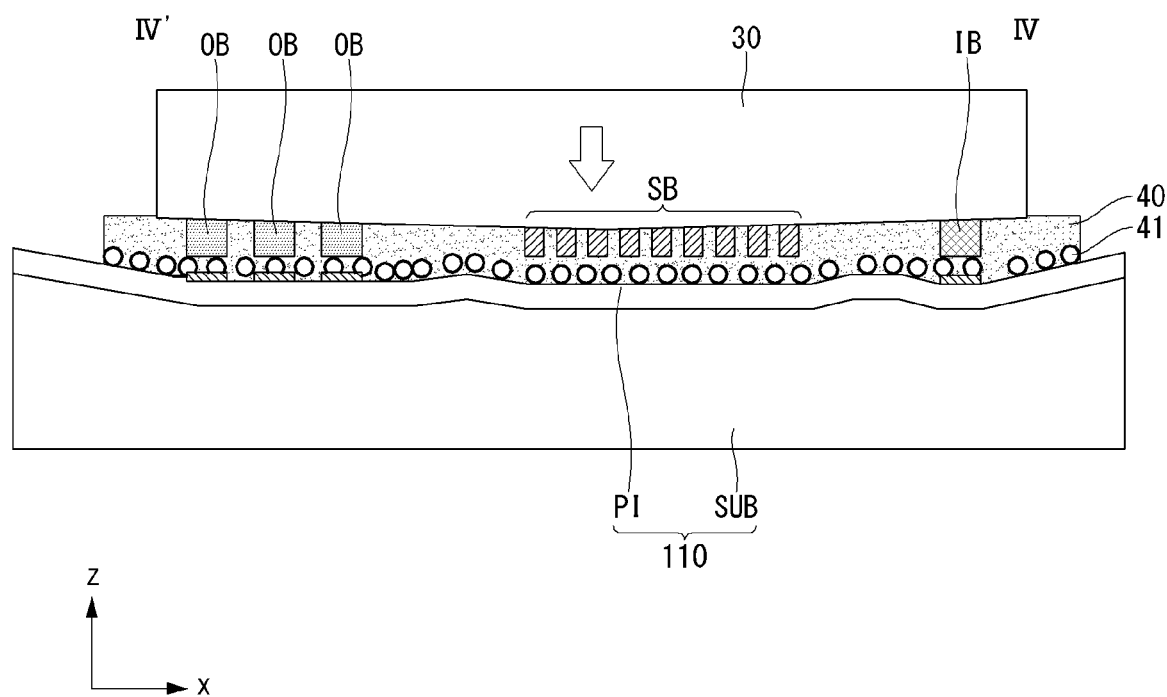
FIG. 24 is a cross-sectional view of the IC package taken along line IV-IV' of FIG. 22.

FIG. 22 is a plan view showing the bottom surface of an IC package according to a sixth embodiment of the disclosure. FIG. 23 is an enlarged view of side barrier bumps shown in FIG. 22. FIG. 24 is a cross-sectional view of the IC package taken along line IV-IV' of FIG. 22. In description of the sixth embodiment, parts substantially the same as those in the above-described embodiments will be denoted by the same reference numbers and detailed description thereof will be omitted or brief.

Referring to FIGS. 22 to 24, the bottom surface of the IC package 30 further includes first and second side barrier bump areas 362 and 364.

The first side barrier bump area 362 is close to a third side SE1 that is the left side in the bottom surface of the IC package 30 and longitudinally disposed in the second direction y. The first side barrier bump area 362 includes a plurality of left side barrier bumps SB. The left side barrier bumps SB are long in the first direction x and can be formed to the same thickness as the input/output bumps IB and OB, as shown in FIG. 23. The left side barrier bumps SB are disposed in the second direction y in the first side barrier bump area 362.

The second side barrier bump area 364 is close to a fourth side SE2 that is the right side in the bottom surface of the IC package 30 and longitudinally disposed in the second direction y. The second side barrier bump area 364 includes a plurality of right side barrier bumps SB. The right side barrier bumps SB are long in the first direction x and can be formed to the same thickness as the input/output bumps IB and OB, as shown in FIG. 23. The right side barrier bumps SB are disposed in the second direction y in the second side barrier bump area 364.

The side barrier bumps SB press the edge of the IC mounting surface of the display panel 100 to inhibit flow of the conductive balls 41 in a COP bonding process. Flow of the conductive balls 41 to the input bumps IB and the output bumps OB can be mitigated only using the side barrier bumps SB. When the left side barrier bumps SB are applied to the IC package 30 along with the aforementioned barrier bumps IBB, OBB and CB, the effect of suppressing deformation of the substrate 110 due to heat and pressure in a COP bonding process can be maximized.

The side barrier bumps SB can be formed to have a size of 80 μm×30 μm and a pitch between the side barrier bumps SB can be set to 40 μm, as shown in FIG. 23, but the disclosure is not limited thereto. The size of the side barrier bumps SB can be appropriately designed in consideration of the IC package 30, the conductive ball size, flow of conductive balls, and the like.

Figure 27:
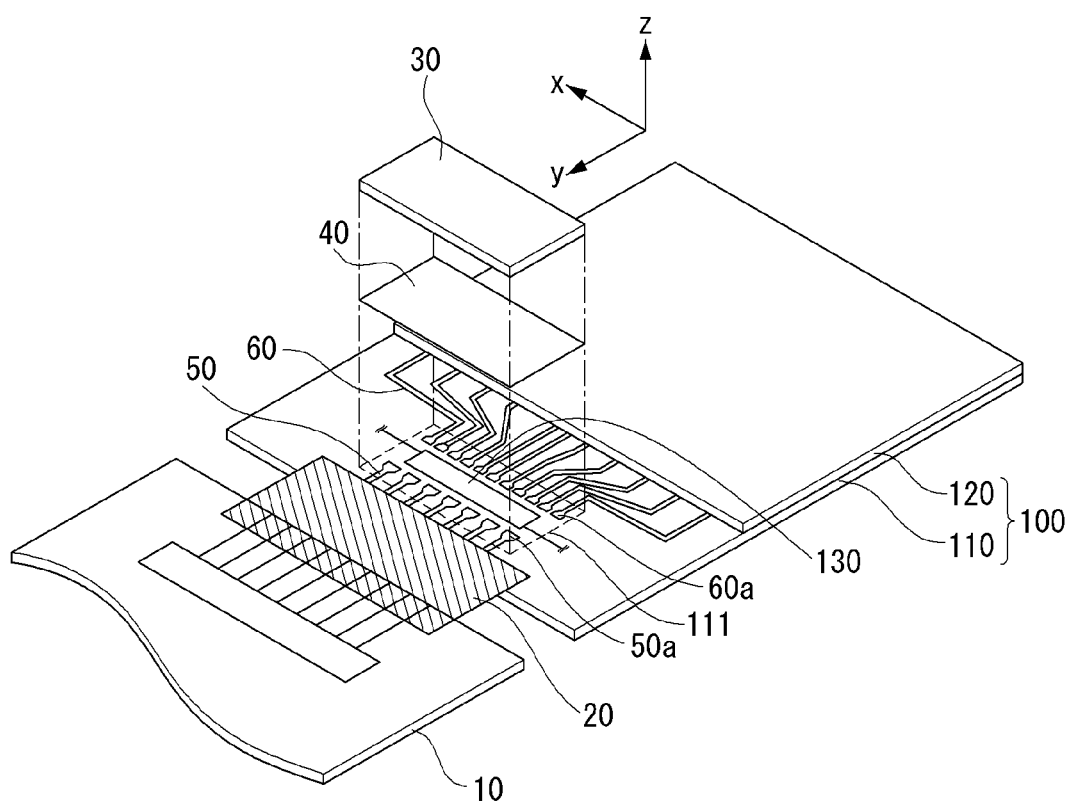
FIG. 27 is a diagram showing an example in which an integrated circuit is disposed on an IC mounting surface of a display panel.
Figure 28:
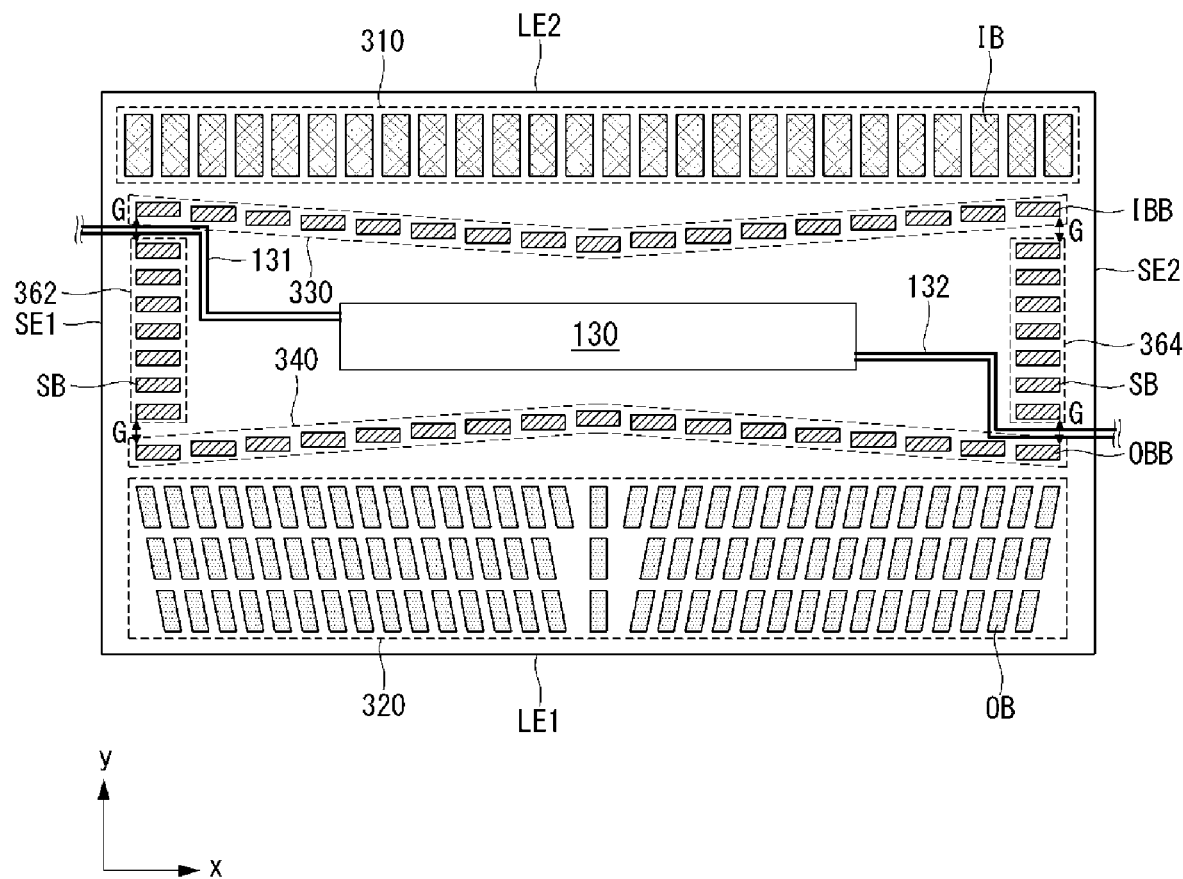
FIG. 28 is a diagram showing an example in which signal lines pass through the IC mounting surface through spaces between input/output bumps and side barrier bumps.

A minimum distance G between the input barrier bumps IBB and the side barrier bump SB can be designed to be more than twice a distance g between neighboring side barrier bumps SB. Similarly, a minimum distance G between the output barrier bumps OBB and the side barrier bump SB can be designed to be more than twice the distance g between neighboring side barrier bumps SB. The signal lines and the power lines of the display panel 100 can pass through the IC mounting surface 111 through spaces secured according to these minimum distances G, as shown in FIGS. 27 and 28.

Figure 25:
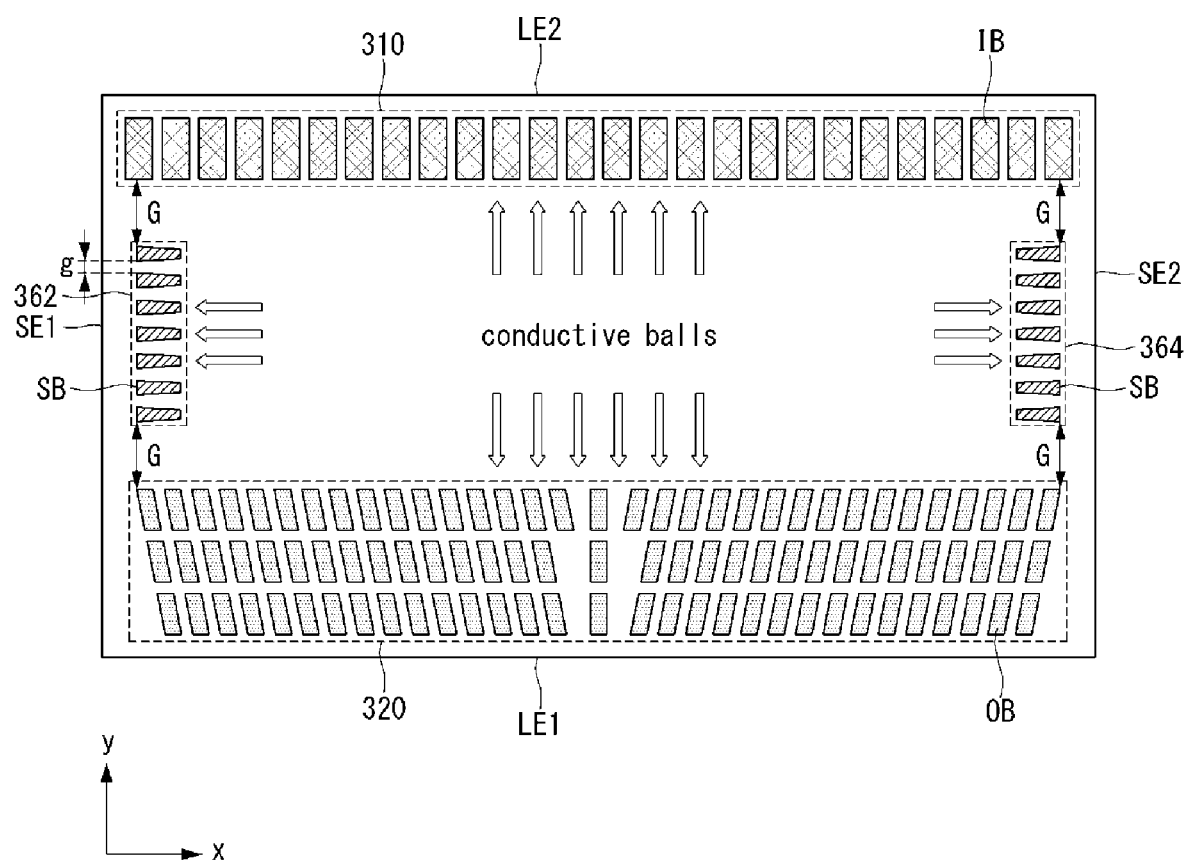
FIG. 25 is a plan view showing a bottom surface of an IC package according to a seventh embodiment of the disclosure.
Figure 26:
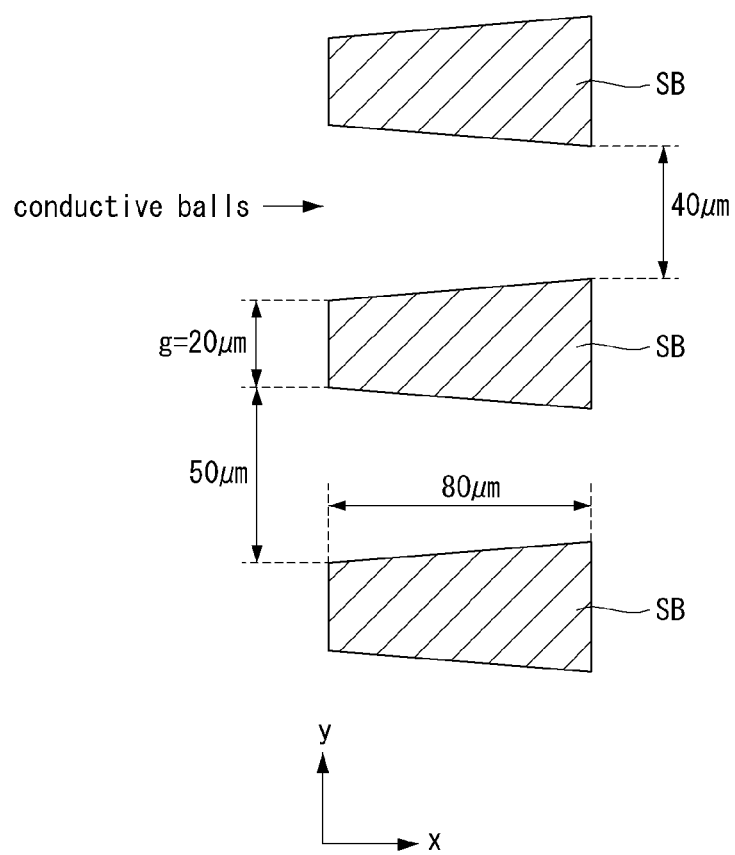
FIG. 26 is an enlarged view of side barrier bumps shown in FIG. 25.

FIG. 25 is a plan view showing the bottom surface of an IC package according to a seventh embodiment of the disclosure. FIG. 26 is an enlarged view of side barrier bumps shown in FIG. 25. In description of the seventh embodiment, parts substantially the same as those in the above-described embodiments will be denoted by the same reference numbers and detailed description thereof will be omitted or brief.

Referring to FIGS. 25 and 26, the side barrier bumps SB can be formed in a trapezoidal form having four sides.

If the sides of side barrier bumps SB facing a flow direction of conductive balls of the ACF 40 are long, flow of conductive balls 41 flowing out of both sides SE1 and SE2 of the IC package 30 can be inhibited during a COP bonding process. When the side barrier bump SB is formed in a trapezoidal shape such that the length of one of the four sides of the side barrier bump SB which faces the center of the IC package 30 decreases, the conductive balls 41 can flow out of both sides SE1 and SE2 of the IC package 30 more smoothly.

Meanwhile, considering the level of mass production technology, it is difficult to form the side barrier bump SB in a triangular shape because a minimum length necessary to form bumps is greater than 0.

The length of one side of the trapezoidal side barrier bump SB which faces the center of the IC package 30 can be set to about 20 μm and a maximum distance between neighboring side barrier bumps SB can be set to 50 μm, as shown in FIG. 26, but the disclosure is not limited thereto. One side of the side barrier bump SB which faces the center of the IC package 30 is a side facing the flow direction of the conductive balls. The size of the side barrier bumps SB can be appropriately designed in consideration of the IC package 30, the size of the conductive balls 41, flow of conductive balls, and the like.

FIG. 27 is a diagram showing an example in which an integrated circuit is disposed on the IC mounting surface of the display panel according to the disclosure. FIG. 28 is a diagram showing an example in which signal lines pass through the IC mounting surface through spaces between input/output bumps and side barrier bumps according to the disclosure.

Referring to FIGS. 27 and 28, an integrated circuit 130 can be disposed in at least a part of the IC mounting surface 111 of the display panel 100. The integrated circuit 130 on the IC mounting surface 111 is covered by the IC package 30 because the IC package 30 covers the IC mounting surface 111 after the COP bonding process.

Although the integrated circuit 130 formed on the IC mounting surface 111 can include a circuit which checks a pixel array failure, the disclosure is not limited thereto. The integrated circuit 130 can include one or more transistor elements.

Signal lines or power lines 131 and 132 can be connected to the integrated circuit 130 on the IC mounting surface 111. These signal lines or power lines can pass through the IC mounting surface 111 through spaces secured by a minimum distance G between input/output bumps IB and OB and side barrier bumps SB, as shown in FIG. 28.

As described above, the IC package according to the disclosure can prevent conductive balls from coming into contact with and congregating on input bumps or output bumps even if the conductive balls move due to a deformation of the ACF by including the first and second barrier bumps.

In addition, the IC package according to the disclosure can reduce movement of conductive balls by including center bumps.

An integrated circuit package and a display device using the same according to various embodiments of the disclosure can be described as follows.

The integrated circuit package can include an integrated circuit, for example, a driving circuit for display device.

A bottom surface of the integrated circuit package can include an input bump area in which a plurality of input bumps are arranged; an output bump area in which a plurality of output bumps are arranged, the output bump area being separated from the input bump area; a first barrier bump area in which a plurality of input barrier bumps are arranged, be disposed between the input bump area and the output bump area; and a second barrier bump area in which a plurality of output barrier bumps are arranged, be disposed between the first barrier bump area and the output bump area. The first barrier bump area is closer to the input bump area than the second barrier bump area, and the second barrier bump area is closer to the output bump area than the first barrier bump area.

In one or more embodiments, the input bumps and the output bumps can be connected to the integrated circuit, for example, the driving circuit for a display device, and the input barrier bumps of the first barrier bump area and output barrier bumps of the second barrier bump area are not connected to the integrated circuit.

In one or more embodiments, the bottom surface can have a rectangular shape having a length in a first direction and a length in a second direction perpendicular to the first direction, the input bumps and the output bumps are arranged in lines in the first direction, and the input barrier bumps of the first barrier bump area and the output barrier bumps of the second barrier bump area are arranged in oblique directions inclined with respect to the first direction.

In one or more embodiments, each of the input barrier bumps of the first barrier bump area and the output barrier bumps of the second barrier bump area can have a rectangular or parallelogram shape.

In one or more embodiments, a distance between a first barrier bump disposed on the leftmost side of the first barrier bump area and a second barrier bump disposed on the leftmost side of the second barrier bump area is the same as a distance between a third barrier bump disposed on the rightmost side of the first barrier bump area and a fourth barrier bump disposed on the rightmost side of the second barrier bump area. In one or more embodiments, a distance between a fifth barrier bump disposed at the center of the first barrier bump area and a sixth barrier bump disposed at the center of the second barrier bump area is less than the distance between the first barrier bump and the second barrier bump.

In one or more embodiments, a distance between a first input bump disposed on the leftmost side of the input bump area and the first barrier bump is the same as a distance between a second input bump disposed on the rightmost side of the input bump area and the third barrier bump. In one or more embodiments, a distance between a third input bump disposed at the center of the input bump area and the fifth barrier bump is greater than a distance between the first input bump and the first barrier bump. In one or more embodiments, a distance between a first output bump disposed on the leftmost side of the output bump area and the second barrier bump is the same as a distance between a second output bump disposed on the rightmost side of the output bump area and the fourth barrier bump. In one or more embodiments, a distance between a third output bump disposed at the center of the output bump area and the sixth barrier bump is greater than a distance between the first output bump and the second barrier bump.

In one or more embodiments, longitudinal sides of the input barrier bumps and the output barrier bumps are inclined in the oblique directions, and sides of the input barrier bumps and the output barrier bumps in the width direction are parallel to the second direction.

In one or more embodiments, the bottom surface of the integrated circuit package can further include a third barrier bump area disposed between the first barrier bump area and the second barrier bump area and including a plurality of central barrier bumps.

In one or more embodiments, the input bumps and the output bumps are connected to the integrated circuit, and the central barrier bumps are not connected to the integrated circuit.

In one or more embodiments, the bottom surface of the integrated circuit package can further include a first side barrier bump area disposed at one edge of the bottom surface and including a plurality of barrier bumps, and a second side barrier bump area disposed at another edge, which is opposite to said one edge, of the bottom surface and including a plurality of barrier bumps. In one or more embodiments, the bottom surface has a rectangular shape having a length in the first direction and a length in the second direction perpendicular to the first direction, the input bumps of the input bump area, the output bumps of the output bump area and the input barrier bumps of the first barrier bump area and the output barrier bumps of the second barrier bump areas are arranged in lines in the first direction, and the barrier bumps of the first and second side barrier bump areas are arranged in the second direction.

In one or more embodiments, a minimum distance G between the input barrier bumps and the barrier bumps in the first and second side barrier bump areas and/or a minimum distance between the output barrier bumps and the barrier bumps in the first and second side barrier bump areas is more than twice a minimum distance between the barrier bumps in the first and second side barrier bump areas.

The display device can include a substrate including a pixel array on which images are displayed; and an integrated circuit package bonded to the substrate, having an integrated circuit therein connected to the pixel array to drive the pixel array.

A bottom surface of the integrated circuit package can include an input bump area in which a plurality of input bumps are arranged; an output bump area in which a plurality of output bumps are arranged, the output bump area being separated from the input bump area; a first barrier bump area in which a plurality of input barrier bumps are arranged, disposed between the input bump area and the output bump area; and a second barrier bump area in which a plurality of output barrier bumps are arranged, disposed between the first barrier bump area and the output bump area. The first barrier bump area is closer to the input bump area than the second barrier bump area, and the second barrier bump area is closer to the output bump area than the first barrier bump area. The substrate includes a plastic substrate.

In one or more embodiments, wherein the substrate includes input pads and output pads connected to the input bumps and output bumps of the integrated circuit package through conductive balls, respectively, and an integrated circuit mounting surface to which the integrated circuit package is bonded. In one or more embodiments, signal lines pass through the integrated circuit mounting surface through a space secured by a minimum distance between the input barrier bumps and output barrier bumps in the first and second barrier bump areas and the side barrier bumps in the first and second side barrier bump areas. The integrated circuit package of the display device may be further configured in accordance with one or more embodiments described herein.

It will be appreciated by persons skilled in the art that the effects of the disclosure are not limited to what has been described above and the above and other effects that the disclosure could achieve will be more clearly understood from the above detailed description.

Although embodiments have been described with reference to a number of illustrative embodiments thereof, it should be understood that numerous other modifications and embodiments can be devised by those skilled in the art that will fall within the scope of the principles of this disclosure.

More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An integrated circuit package comprising:
an integrated circuit,
wherein a bottom surface of the integrated circuit package includes:
an input bump area in which a plurality of input bumps are arranged;
an output bump area in which a plurality of output bumps are arranged, the output bump area being separated from the input bump area;
a first barrier bump area in which a plurality of input barrier bumps are arranged, the first barrier bump area disposed between the input bump area and the output bump area;
a second barrier bump area in which a plurality of output barrier bumps are arranged, disposed between the first barrier bump area and the output bump area; and
a side barrier bump area in which a plurality of side barrier bumps are arranged without the input bumps and the output bumps, and respectively disposed in a region defined by both ends of the input bump area and both ends of the output bump area,
wherein the first barrier bump area is closer to the input bump area than the second barrier bump area, and the second barrier bump area is closer to the output bump area than the first barrier bump area, and
wherein each the input barrier bumps has a first width wider than that of each the input bumps, and each the output barrier bumps has a second width wider than that of each the output bumps.

2. The integrated circuit package of claim 1, wherein the input bumps and the output bumps are connected to the integrated circuit, and the input barrier bumps of the first barrier bump area and the output barrier bumps of the second barrier bump area are not connected to the integrated circuit.

3. The integrated circuit package of claim 1, wherein the bottom surface of the integrated circuit package has a rectangular shape having a length in a first direction and a length in a second direction perpendicular to the first direction, the input bumps and the output bumps are arranged in lines in the first direction, and the input barrier bumps of the first barrier bump area and the output barrier bumps of the second barrier bump area are arranged in oblique directions inclined with respect to the first direction.

4. The integrated circuit package of claim 1, wherein each of the input barrier bumps of the first barrier bump area and the output barrier bumps of the second barrier bump area has a rectangular or parallelogram shape.

5. The integrated circuit package of claim 3, wherein a distance between a first barrier bump disposed on the leftmost side of the first barrier bump area and a second barrier bump disposed on the left most side of the second barrier bump area is same as a distance between a third barrier bump disposed on the rightmost side of the first barrier bump area and a fourth barrier bump disposed on the rightmost side of the second barrier bump area, and
a distance between a fifth barrier bump disposed at the center of the first barrier bump area and a sixth barrier bump disposed at the center of the second barrier bump area is less than the distance between the first barrier bump and the second barrier bump.

6. The integrated circuit package of claim 5, wherein a distance between a first input bump disposed on the leftmost side of the input bump area and the first barrier bump is same as a distance between a second input bump disposed on the rightmost side of the input bump area and the third barrier bump,
a distance between a third input bump disposed at the center of the input bump area and the fifth barrier bump is greater than a distance between the first input bump and the first barrier bump,
a distance between a first output bump disposed on the leftmost side of the output bump area and the second barrier bump is same as a distance between a second output bump disposed on the rightmost side of the output bump area and the fourth barrier bump, and
a distance between a third output bump disposed at the center of the output bump area and the sixth barrier bump is greater than a distance between the first output bump and the second barrier bump.

7. The integrated circuit package of claim 3, wherein longitudinal sides of the input barrier bumps and the output barrier bumps are inclined in the oblique directions, and sides of the input barrier bumps and the output barrier bumps in the width direction are parallel to the second direction.

8. The integrated circuit package of claim 1, wherein the bottom surface of the integrated circuit package further includes a third barrier bump area disposed between the first barrier bump area and the second barrier bump area and including a plurality of central barrier bumps.

9. The integrated circuit package of claim 8, wherein the input bumps and the output bumps are connected to the integrated circuit, and the barrier bumps are not connected to the integrated circuit.

10. The integrated circuit package of claim 1, wherein the side barrier bump area includes a first side barrier bump area disposed at one edge of the bottom surface and including a plurality of first side barrier bumps, and a second side barrier bump area disposed at another edge, which is opposite to said one edge, of the bottom surface and including a plurality of second side barrier bumps, and
wherein the bottom surface has a rectangular shape having a length in the first direction and a length in the second direction perpendicular to the first direction, the input bumps of the input bump area, the output bumps of the output bump area and the input and output barrier bumps of the first and second barrier bump areas are arranged in lines in the first direction, and the first and second side barrier bumps of the first and second side barrier bump areas are arranged in the second direction.

11. The integrated circuit package of claim 10, wherein a minimum distance between the input barrier bumps of the first barrier bump area and the first and second side barrier bumps in the first and second side barrier bump areas and/or a minimum distance between the output barrier bumps of the second barrier bump area and the first and second side barrier bumps in the first and second side barrier bump areas is more than twice a minimum distance between the barrier bumps in the first and second side barrier bump areas.

12. A display device comprising:
a substrate including a pixel array configured to display images; and
an integrated circuit package bonded to the substrate, and having an integrated circuit connected to the pixel array to drive the pixel array, wherein a bottom surface of the integrated circuit package includes:
an input bump area in which a plurality of input bumps are arranged;
an output bump area in which a plurality of output bumps are arranged, the output bump area being separated from the input bump area;
a first barrier bump area in which a plurality of input barrier bumps are arranged, disposed between the input bump area and the output bump area;
a second barrier bump area in which a plurality of output barrier bumps are arranged, the second barrier bump area configured to be disposed between the first barrier bump area and the output bump area; and
a side barrier bump area in which a plurality of side barrier bumps are arranged without the input bumps and the output bumps, and respectively disposed in a region defined by both ends of the input bump area and both ends of the output bump area,
wherein the first barrier bump area is closer to the input bump area than the second barrier bump area, and the second barrier bump area is closer to the output bump area than the first barrier bump area, and
wherein each the input barrier bumps has a first width wider than that of each the input bumps, and each the output barrier bumps has a second width wider than that of each the output bumps.

13. The display device of claim 12, wherein the substrate includes a plastic substrate.

14. The display device of claim 12, wherein the bottom surface of the integrated circuit package has a rectangular shape having a length in a first direction and a length in a second direction perpendicular to the first direction, the input bumps and the output bumps are arranged in lines in the first direction, and the input barrier bumps of the first barrier bump area and the output barrier bumps of the second barrier bump area are arranged in oblique directions inclined with respect to the first direction.

15. The display device of claim 14, wherein a distance between a first barrier bump disposed on the leftmost side of the first barrier bump area and a second barrier bump disposed on the left most side of the second barrier bump area is same as a distance between a third barrier bump disposed on the rightmost side of the first barrier bump area and a fourth barrier bump disposed on the rightmost side of the second barrier bump area, and
a distance between a fifth barrier bump disposed at the center of the first barrier bump area and a sixth barrier bump disposed at the center of the second barrier bump area is less than the distance between the first barrier bump and the second barrier bump.

16. The display device of claim 15, wherein a distance between a first input bump disposed on the leftmost side of the input bump area and the first barrier bump is same as a distance between a second input bump disposed on the rightmost side of the input bump area and the third barrier bump,
a distance between a third input bump disposed at the center of the input bump area and the fifth barrier bump is greater than a distance between the first input bump and the first barrier bump,
a distance between a first output bump disposed on the leftmost side of the output bump area and the second barrier bump is same as a distance between a second output bump disposed on the rightmost side of the output bump area and the fourth barrier bump, and
a distance between a third output bump disposed at the center of the output bump area and the sixth barrier bump is greater than a distance between the first output bump and the second barrier bump.

17. The display device of claim 14, wherein longitudinal sides of the input barrier bumps and the output barrier bumps are inclined in the oblique directions, and sides of the input barrier bumps and the output barrier bumps in the width direction are parallel to the second direction.

18. The display device of claim 12, wherein the bottom surface of the integrated circuit package further includes a third barrier bump area disposed between the first barrier bump area and the second barrier bump area and including a plurality of central barrier bumps.

19. The display device of claim 12, wherein the side barrier bump area includes a first side barrier bump area disposed at one edge of the bottom surface and including a plurality of first side barrier bumps, and a second side barrier bump area disposed at another edge, which is opposite to said one edge, of the bottom surface and including a plurality of second side barrier bumps, and
wherein the bottom surface has a rectangular shape having a length in the first direction and a length in the second direction perpendicular to the first direction, the input bumps of the input bump area, the output bumps of the output bump area and the input and output barrier bumps of the first and second barrier bump areas are arranged in lines in the first direction, and the first and second side barrier bumps of the first and second side barrier bump areas are arranged in the second direction.

20. The display device of claim 12, wherein the substrate includes input pads and output pads connected to the input bumps and output bumps of the integrated circuit package through conductive balls, respectively, and an integrated circuit mounting surface to which the integrated circuit package is bonded,
wherein the side barrier bump area includes a first side barrier bump area disposed at one edge of the bottom surface and including a plurality of first side barrier bumps, and a second side barrier bump area disposed at the other edge of the bottom surface and including a plurality of second side barrier bumps,
a minimum distance between the input bumps of the input bump area and the side barrier bumps is more than twice a minimum distance between the first and second side barrier bumps in the first and second side barrier bump areas, and
signal lines pass through the integrated circuit mounting surface through a space secured by a minimum distance between the input barrier bumps and output barrier bumps in the first and second barrier input bump area and the output bump area and the first and second side barrier bumps in the first and second side barrier bump areas.

* * * * *